US009368551B2

(12) United States Patent
Masuoka et al.

(10) Patent No.: US 9,368,551 B2
(45) Date of Patent: Jun. 14, 2016

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/789,370

(22) Filed: Jul. 1, 2015

(65) Prior Publication Data

US 2015/0303238 A1    Oct. 22, 2015

Related U.S. Application Data

(63) Continuation of application No. 14/593,659, filed on Jan. 9, 2015, now Pat. No. 9,117,747.

(30) Foreign Application Priority Data

Jan. 23, 2014    (JP) ................. 2014-010449

(51) Int. Cl.
*H01L 29/00* (2006.01)
*H01L 43/00* (2006.01)
(Continued)

(52) U.S. Cl.
CPC ...... *H01L 27/228* (2013.01); *H01L 21/823487* (2013.01); *H01L 27/0886* (2013.01);
(Continued)

(58) Field of Classification Search
CPC .............. H01L 21/823487; H01L 21/8258; H01L 21/85255; H01L 27/228; H01L 27/0886; H01L 27/243; H01L 43/12; H01L 43/08; H01L 43/10; H01L 29/42364; H01L 29/66484; H01L 29/66545; H01L 29/66795; H01L 29/7855
See application file for complete search history.

(56) References Cited

U.S. PATENT DOCUMENTS 6,891,234 B1    5/2005  Connelly et al.
8,080,458 B2   12/2011  Masuoka et al.
(Continued)

FOREIGN PATENT DOCUMENTS

JP    11-297984 A    10/1999
JP    2004-356314 A    12/2004
(Continued)

OTHER PUBLICATIONS

Office Action for U.S. Appl. No. 14/593,659 dated Oct. 13, 2009, 25 pages.
(Continued)

*Primary Examiner* — Nikolay Yushin
(74) *Attorney, Agent, or Firm* — Brinks Gilson & Lione

(57) ABSTRACT

A semiconductor device includes a first fin-shaped semiconductor layer on a semiconductor substrate, a first insulating film around the first fin-shaped semiconductor layer, a first pillar-shaped semiconductor layer on the first fin-shaped semiconductor layer, a first gate insulating film around the first pillar-shaped semiconductor layer, a first gate line formed around the first gate insulating film and extending in a direction perpendicular to the first fin-shaped semiconductor layer, a second diffusion layer disposed in a lower portion of the first pillar-shaped semiconductor layer, a third gate insulating film surrounding an upper portion of the first pillar-shaped semiconductor layer, a first contact electrode surrounding the third gate insulating film, a second contact electrode that connects an upper portion of the first contact electrode to an upper portion of the first pillar-shaped semiconductor layer, and a first magnetic tunnel junction memory element on the second contact electrode.

8 Claims, 45 Drawing Sheets

(51) Int. Cl.
   *H01L 27/22* (2006.01)
   *H01L 27/088* (2006.01)
   *H01L 29/78* (2006.01)
   *H01L 29/66* (2006.01)
   *H01L 21/8234* (2006.01)
   *H01L 43/12* (2006.01)
   *H01L 29/423* (2006.01)

(52) U.S. Cl.
   CPC .... *H01L29/42364* (2013.01); *H01L 29/66484* (2013.01); *H01L 29/66545* (2013.01); *H01L 29/66795* (2013.01); *H01L 29/7855* (2013.01); *H01L 43/12* (2013.01)

(56) References Cited

U.S. PATENT DOCUMENTS

| | | | |
|---|---|---|---|
| 8,299,507 | B2 | 10/2012 | Shimizu et al. |
| 8,759,178 | B2 | 6/2014 | Masuoka et al. |
| 2009/0200604 | A1 | 8/2009 | Chidambarrao et al. |
| 2010/0224916 | A1 | 9/2010 | Shimizu et al. |
| 2012/0068255 | A1 | 3/2012 | Lee et al. |
| 2013/0040408 | A1 | 2/2013 | Nam et al. |
| 2013/0056812 | A1 | 3/2013 | Kim et al. |
| 2013/0113037 | A1 | 5/2013 | Masuoka et al. |

FOREIGN PATENT DOCUMENTS

| | | |
|---|---|---|
| JP | 2008-147587 A | 6/2008 |
| JP | 2008-218514 A | 9/2008 |
| JP | 2012-069538 | 4/2012 |
| JP | 2013-093592 A | 5/2013 |
| WO | WO 2013/171873 A1 | 11/2013 |

OTHER PUBLICATIONS

Office Action for U.S. Appl. No. 14/593,659 dated Jun. 14, 2010, 16 pages.

Notice of Allowance for U.S. Appl. No. 14/593,659 dated Feb. 16, 2011, 6 pages.

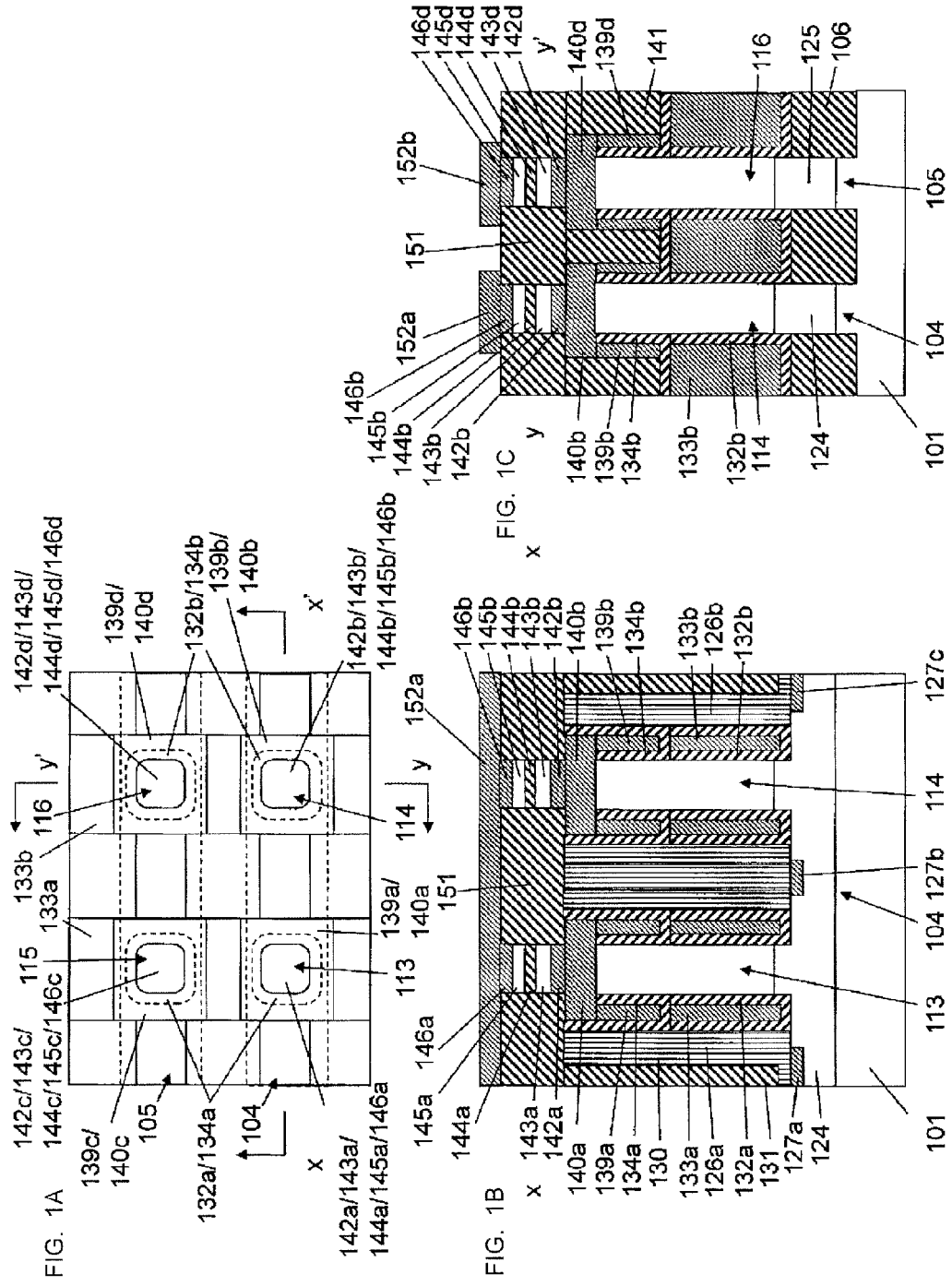

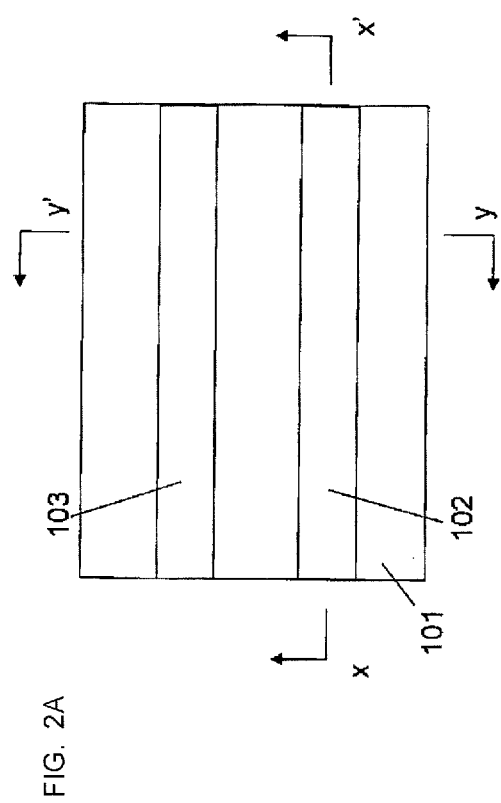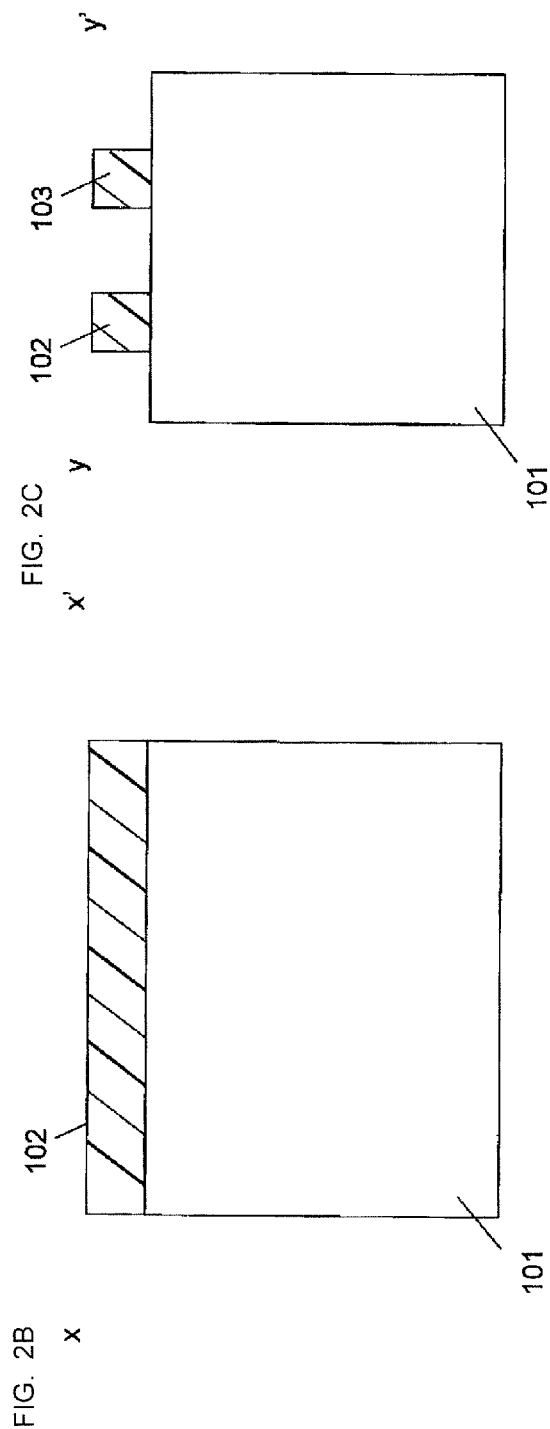

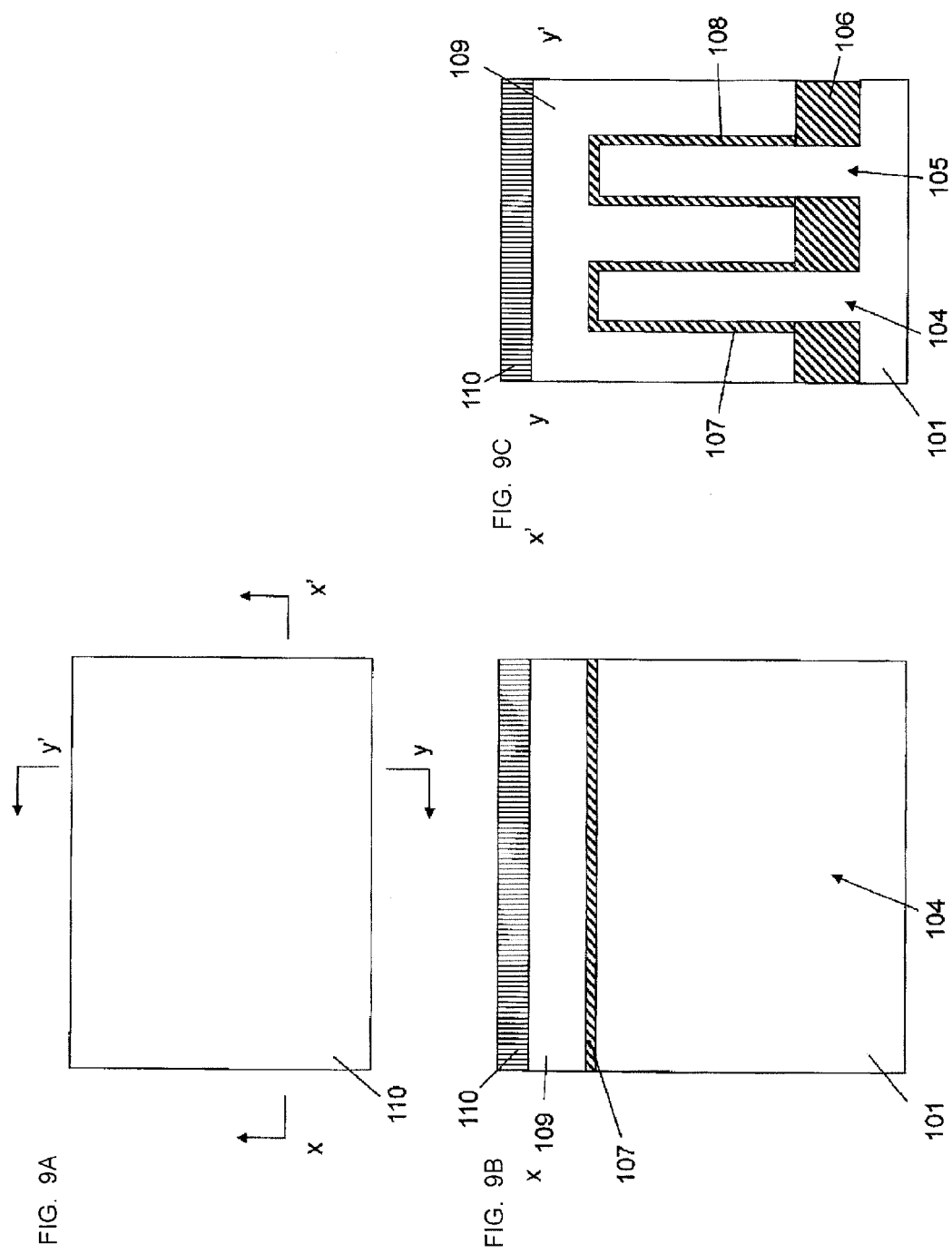

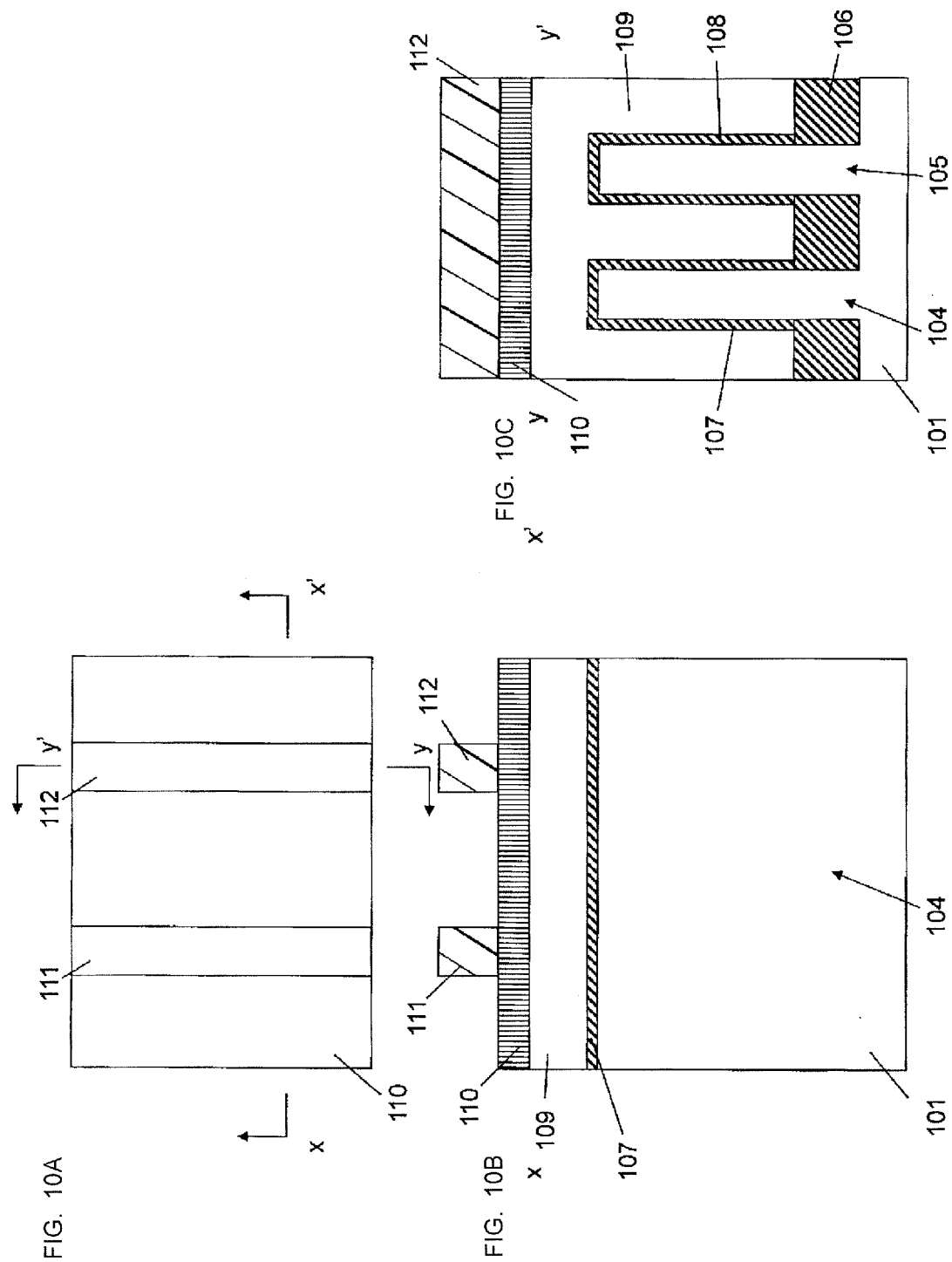

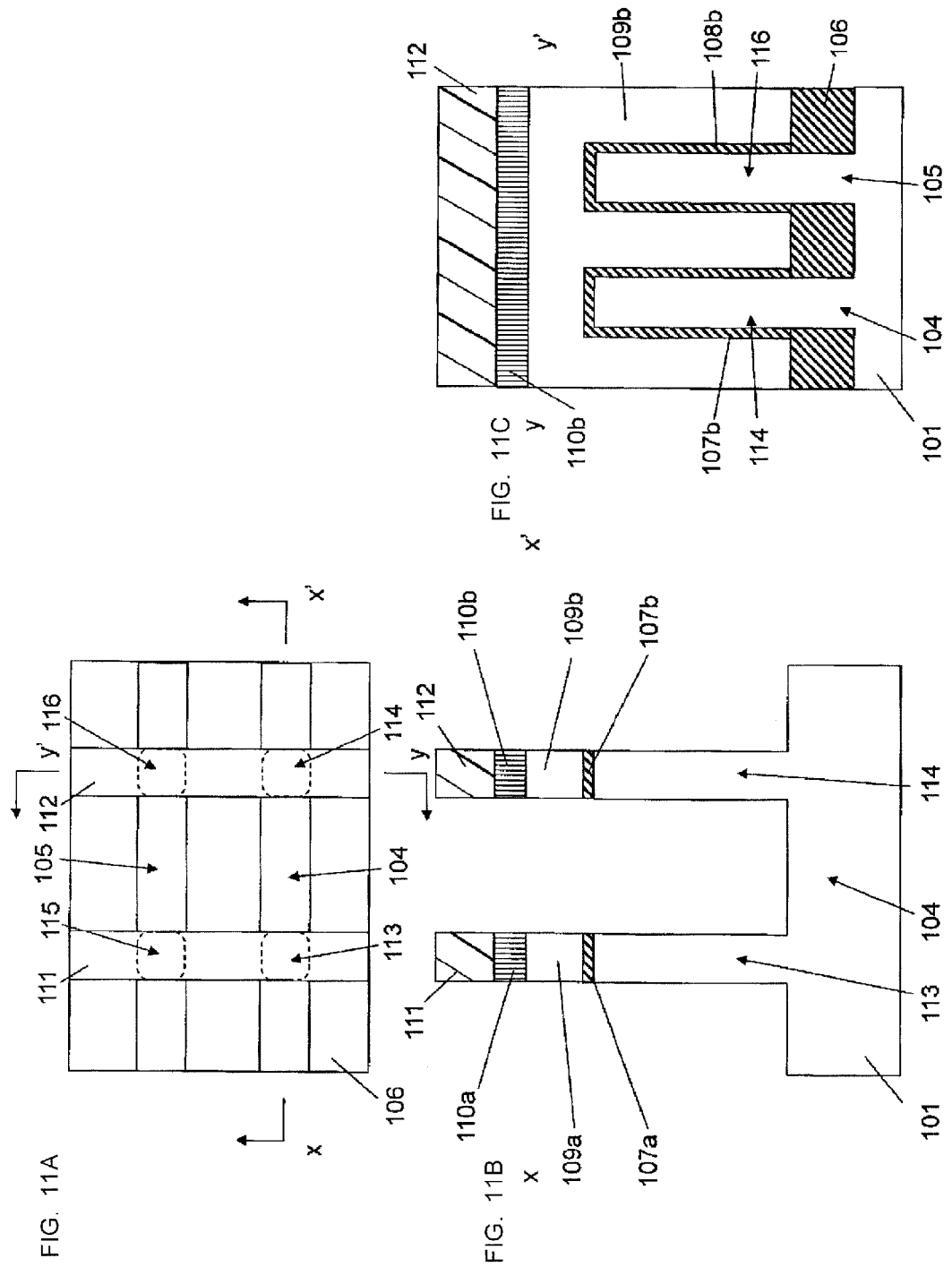

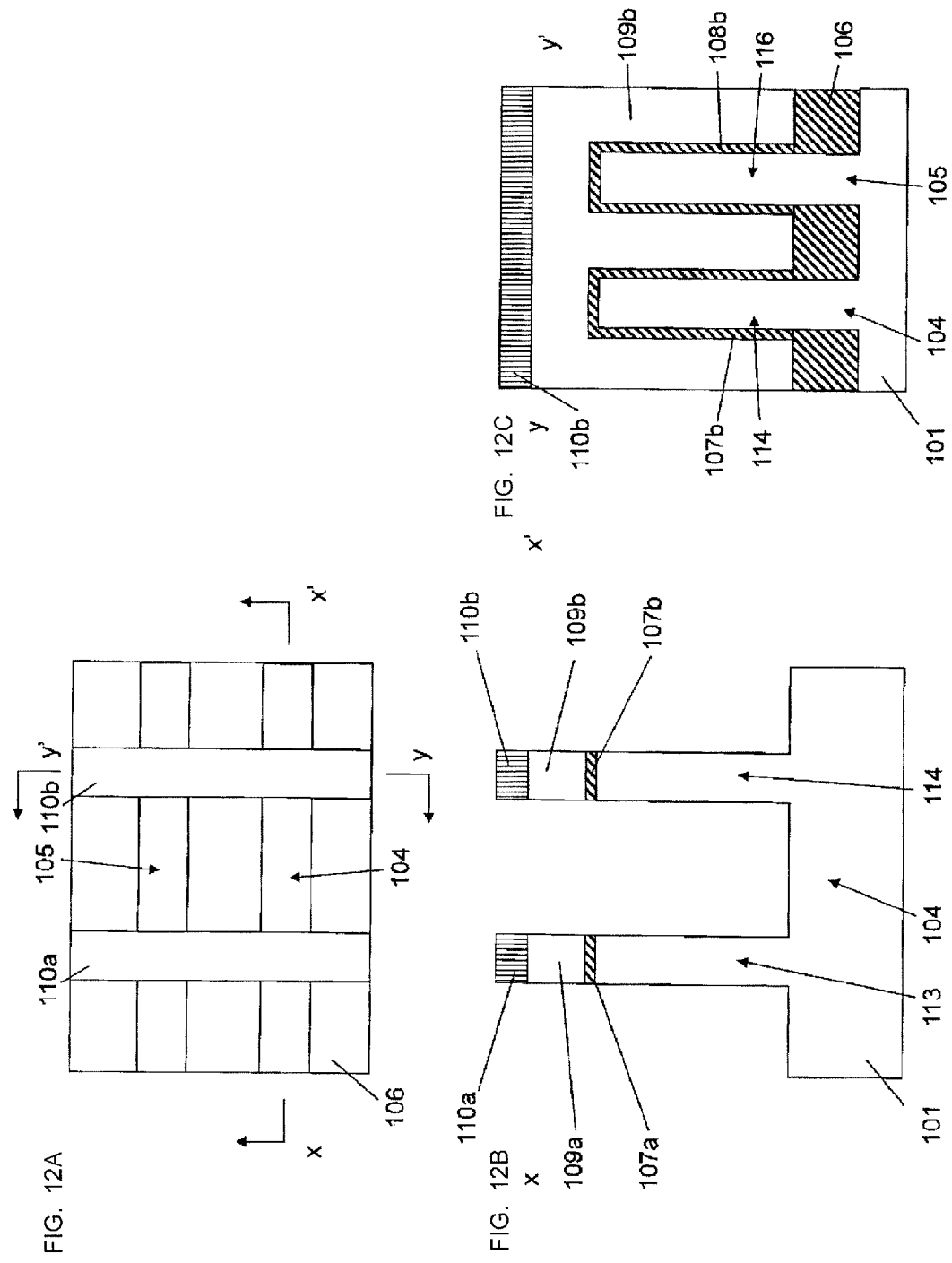

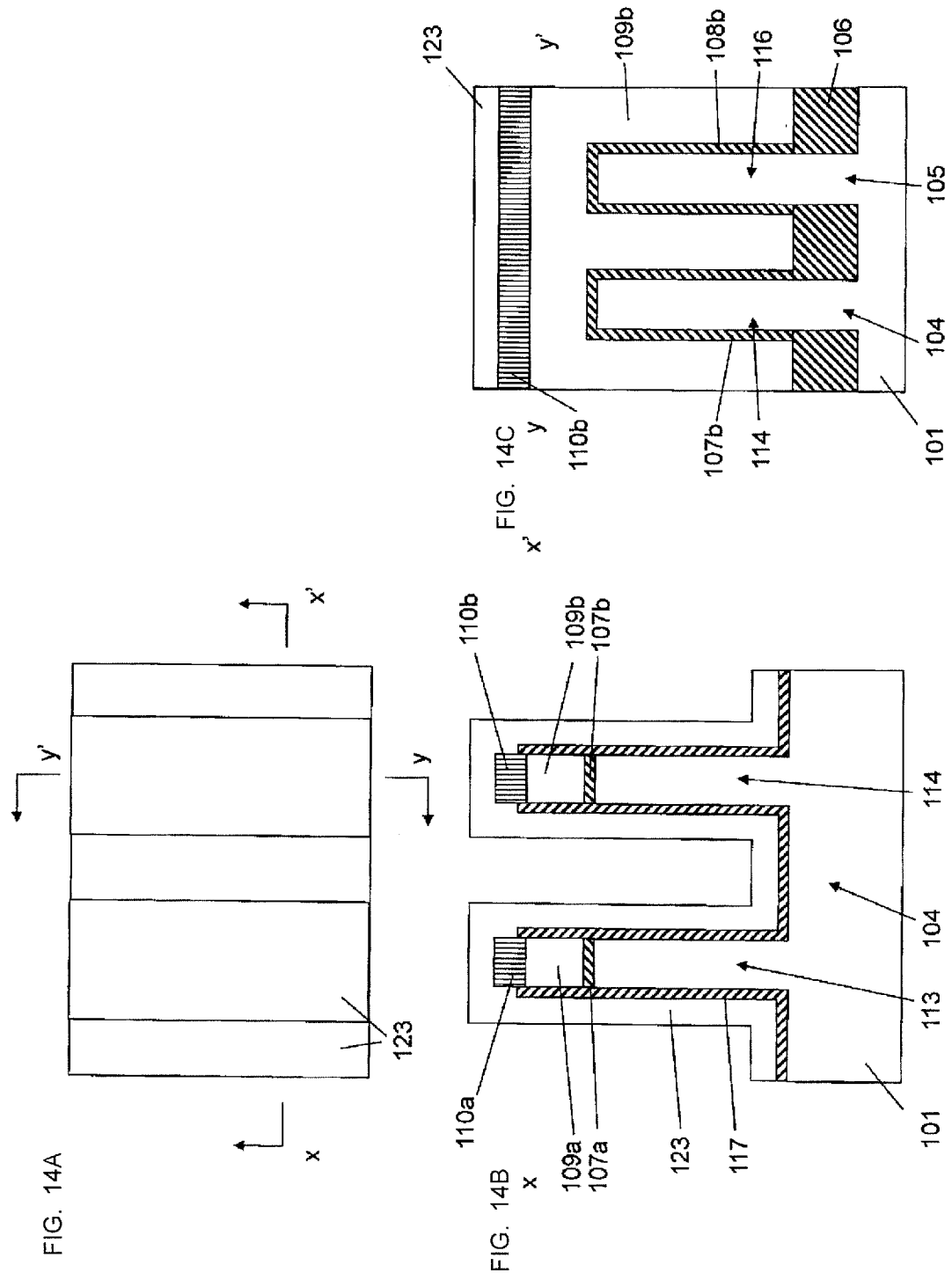

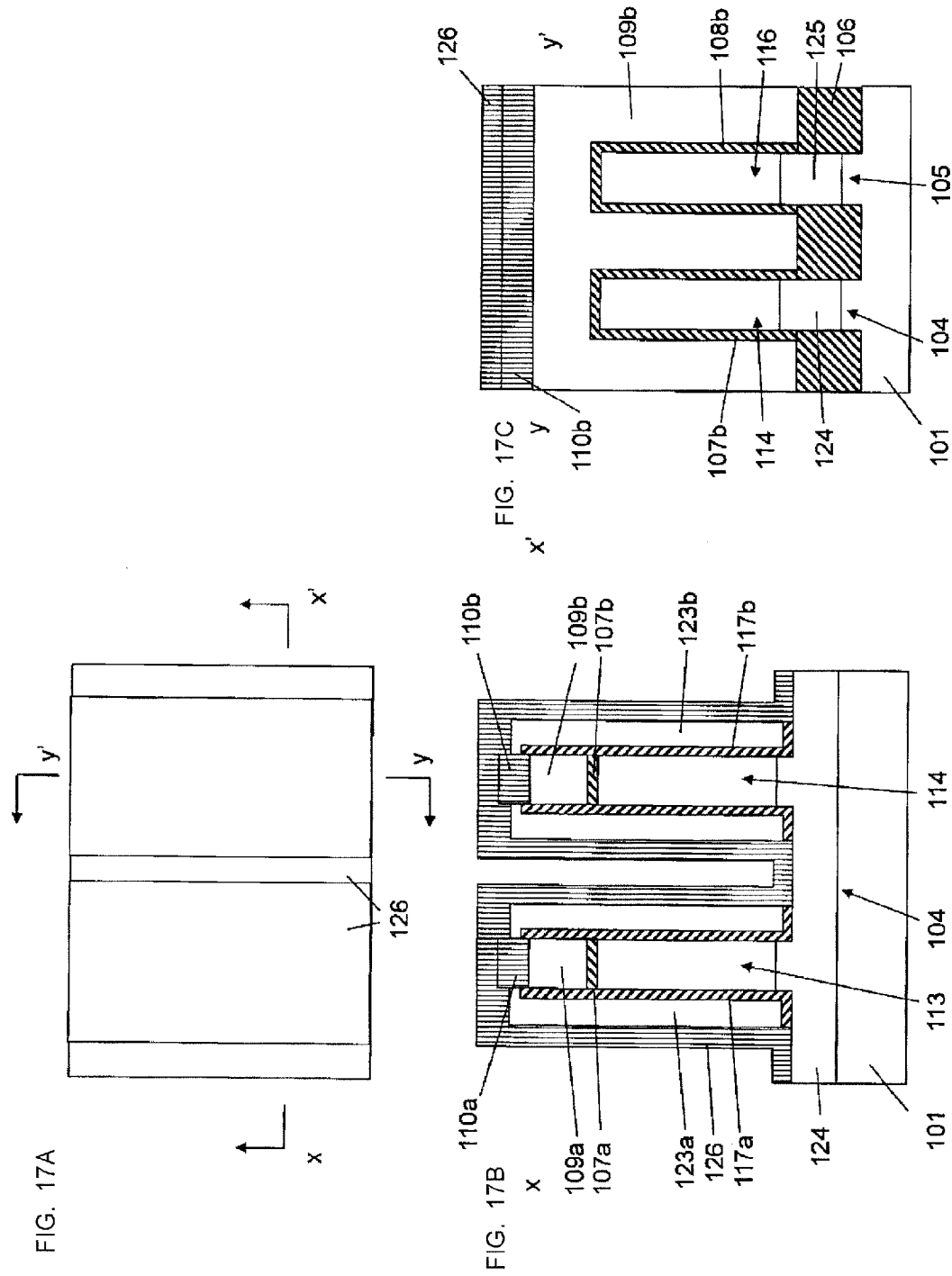

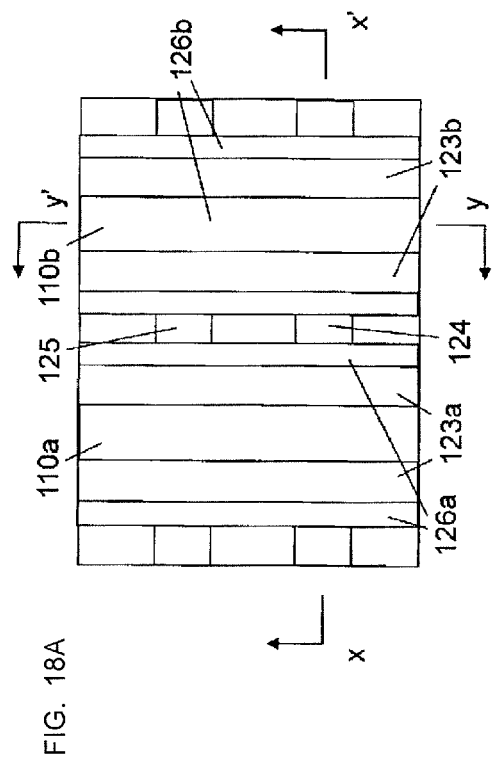
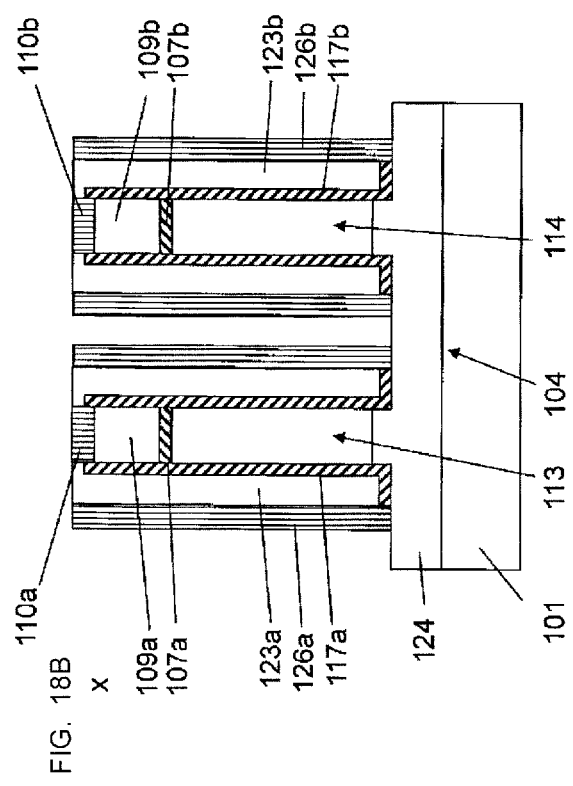
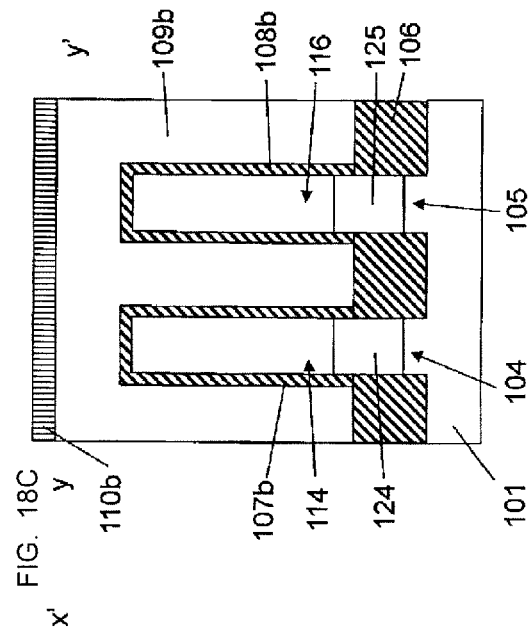
FIG. 18A
FIG. 18B
FIG. 18C

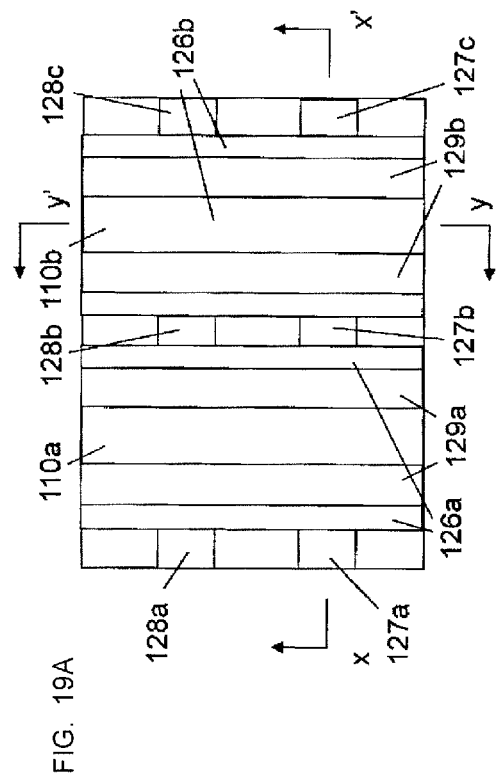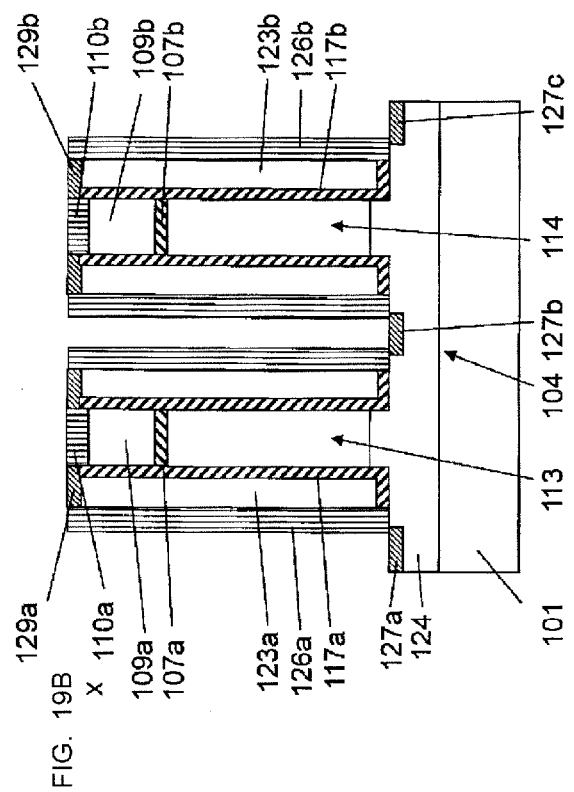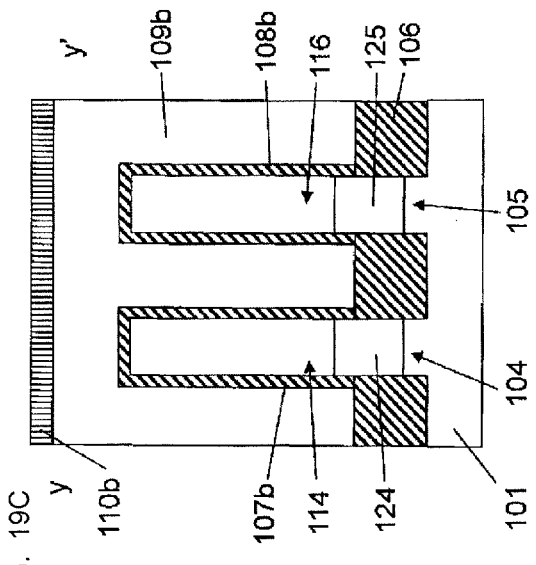

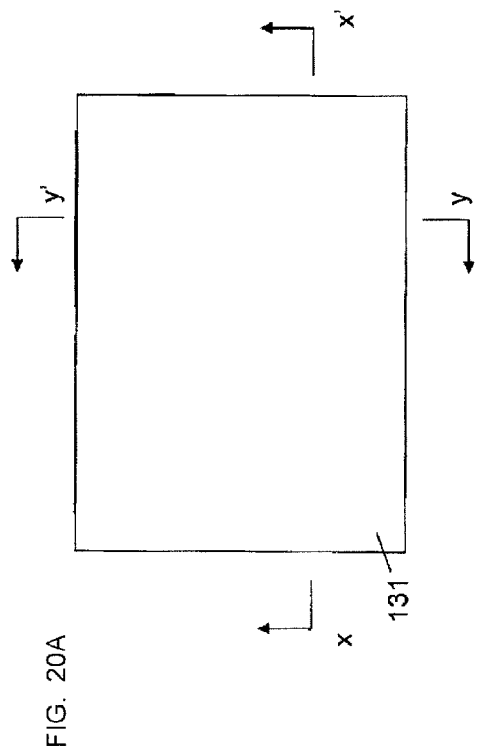
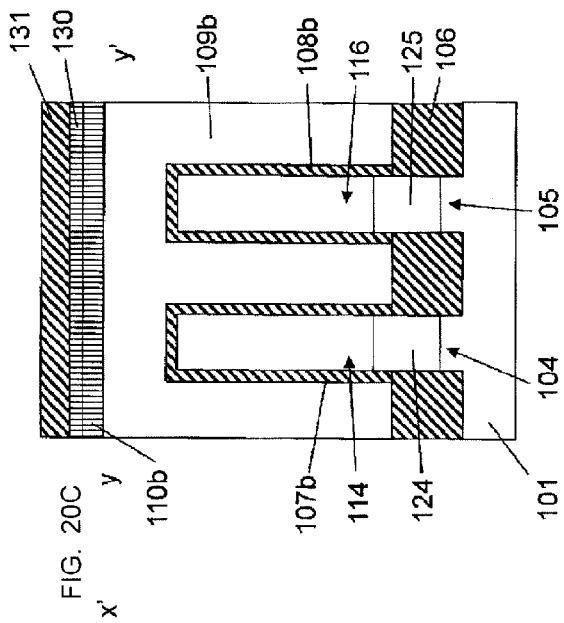
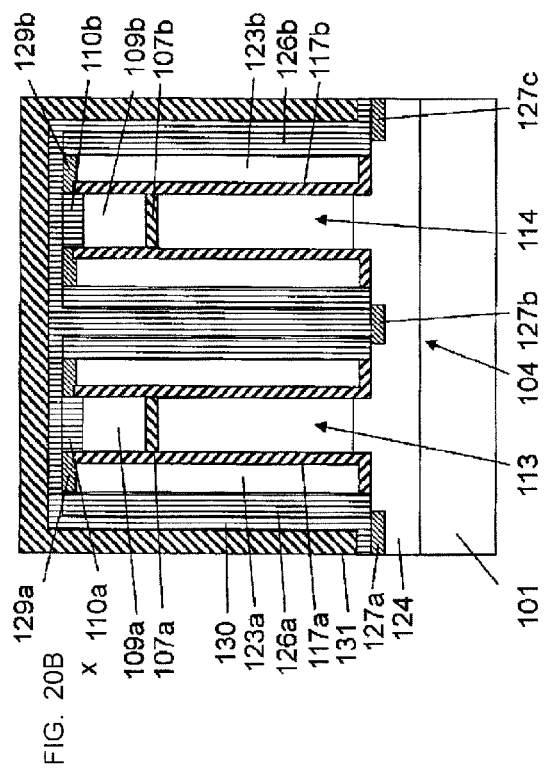

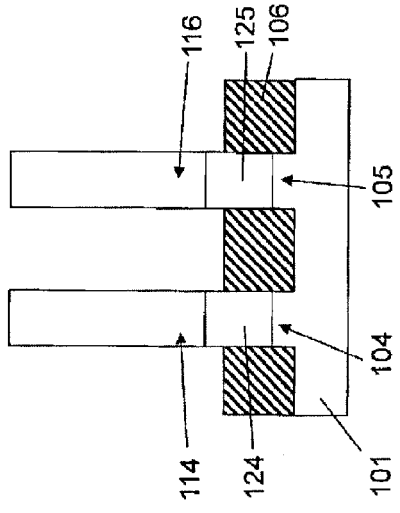
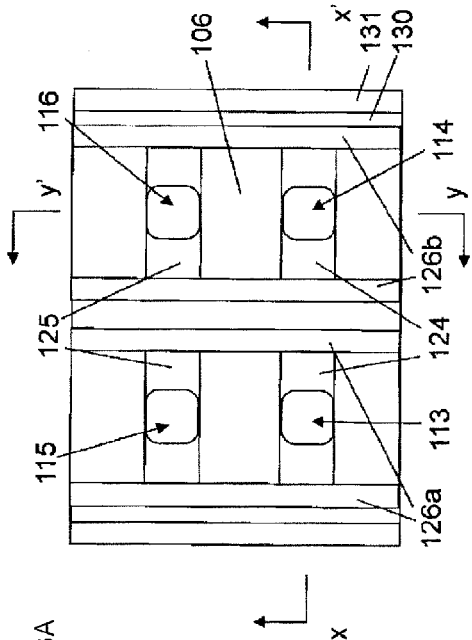
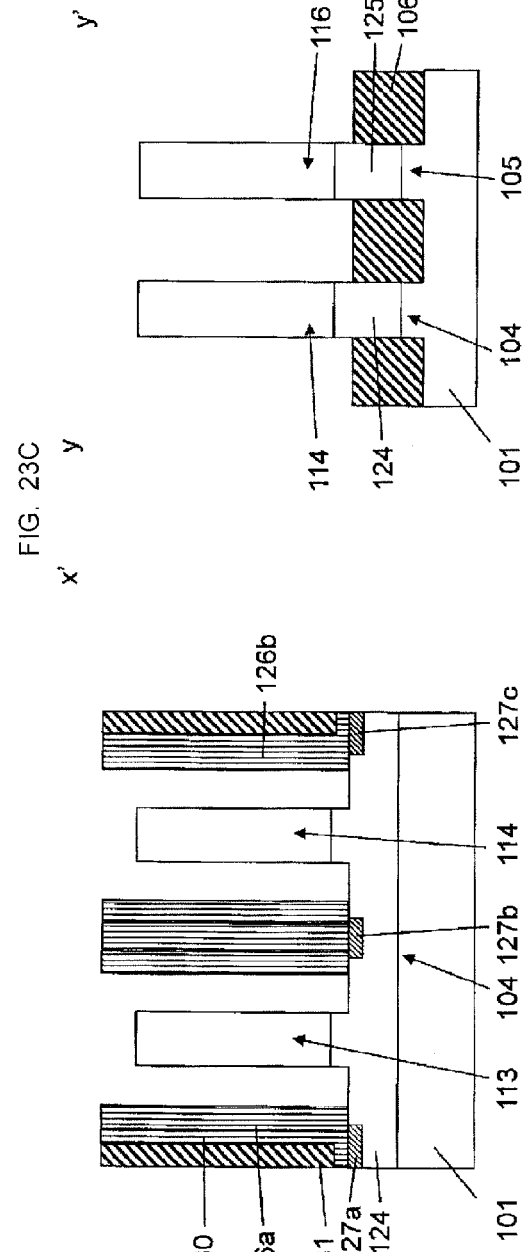

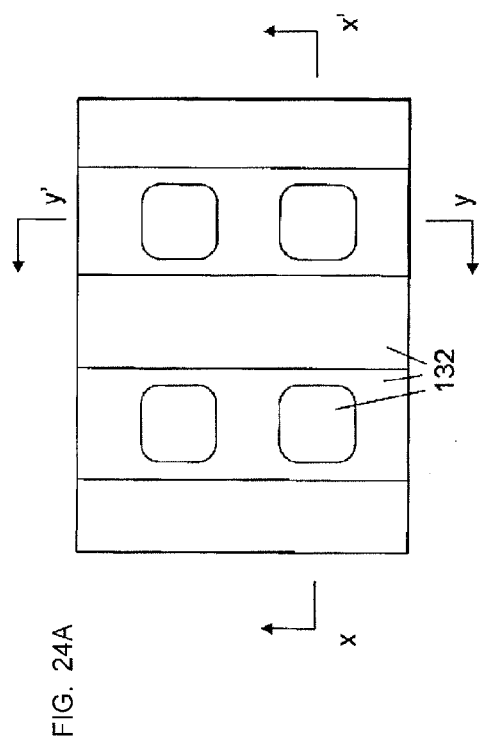
FIG. 24A
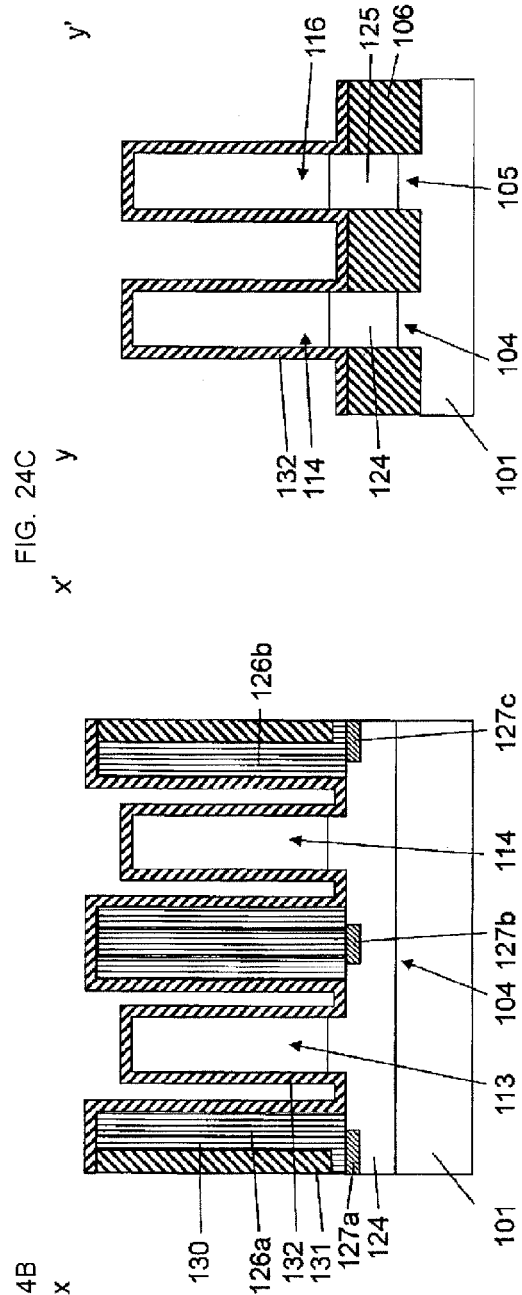
FIG. 24C
FIG. 24B

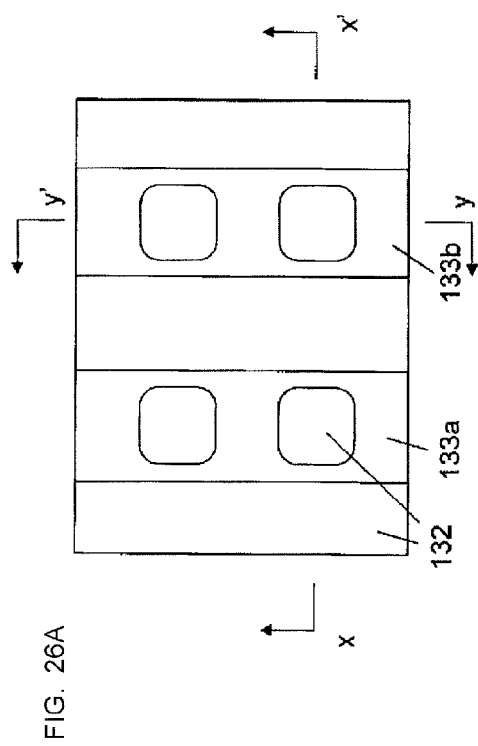
FIG. 26A
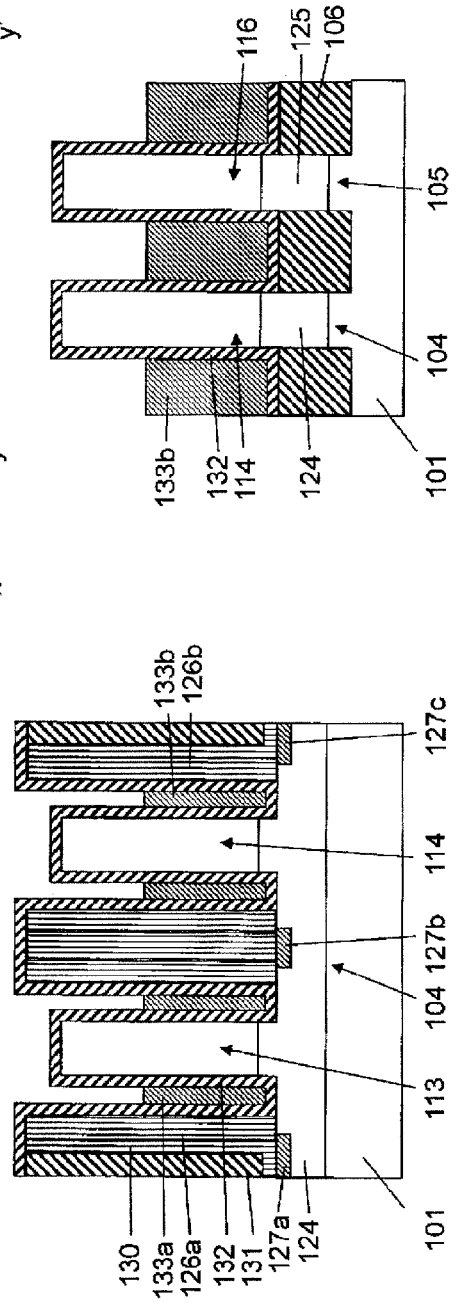
FIG. 26B
FIG. 26C

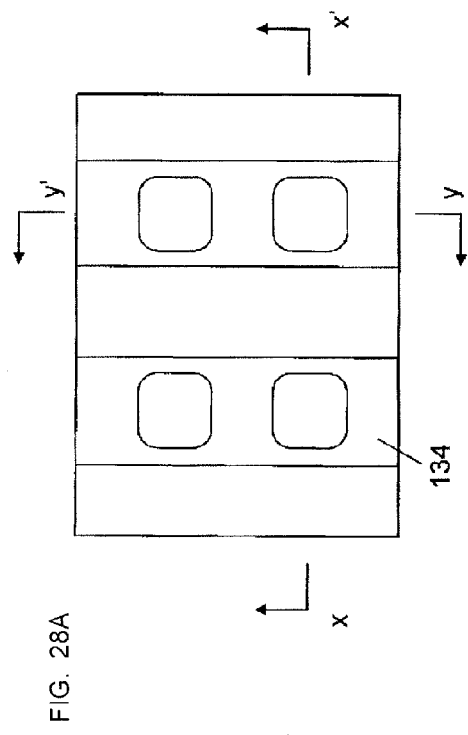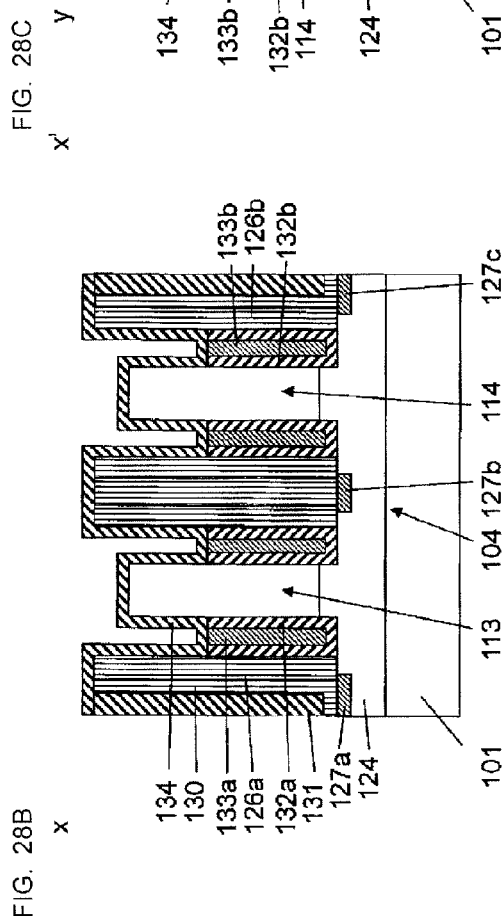

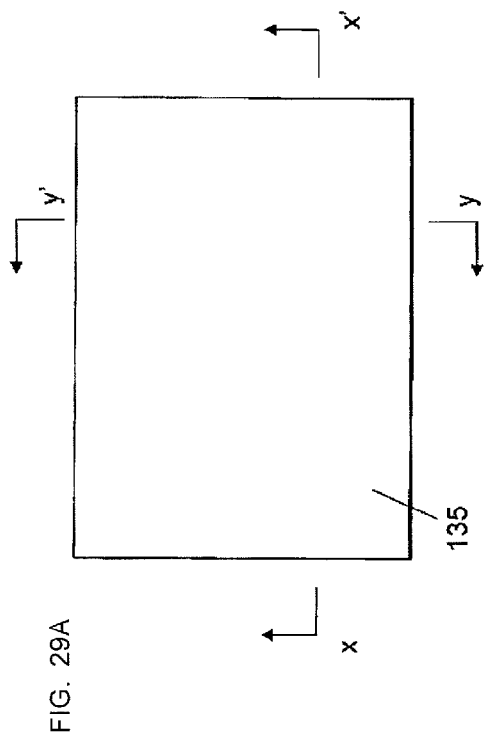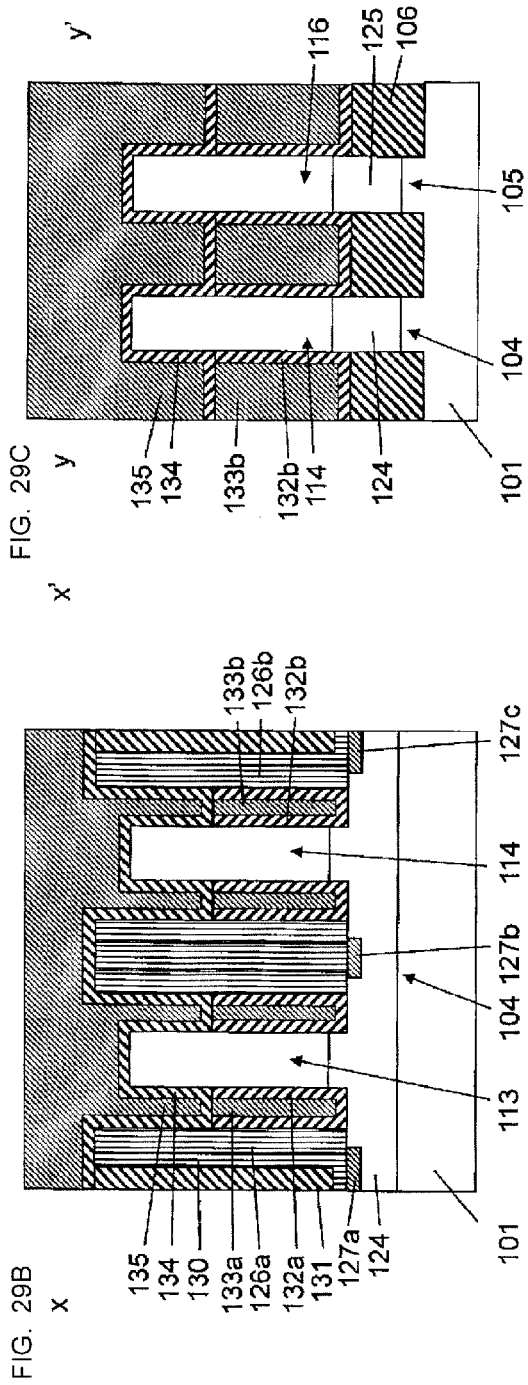

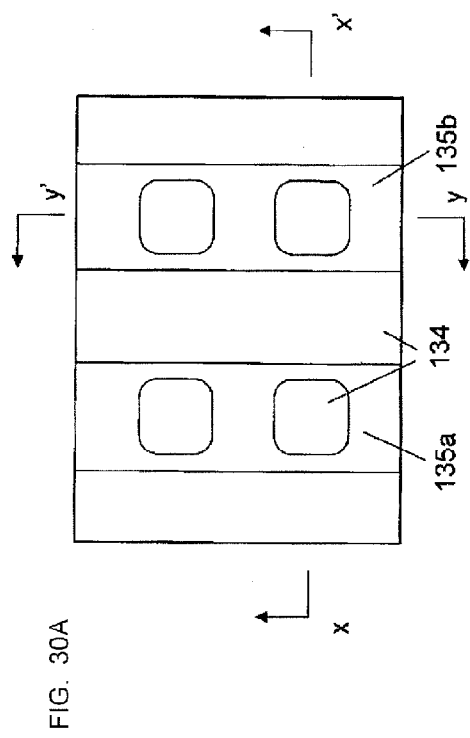
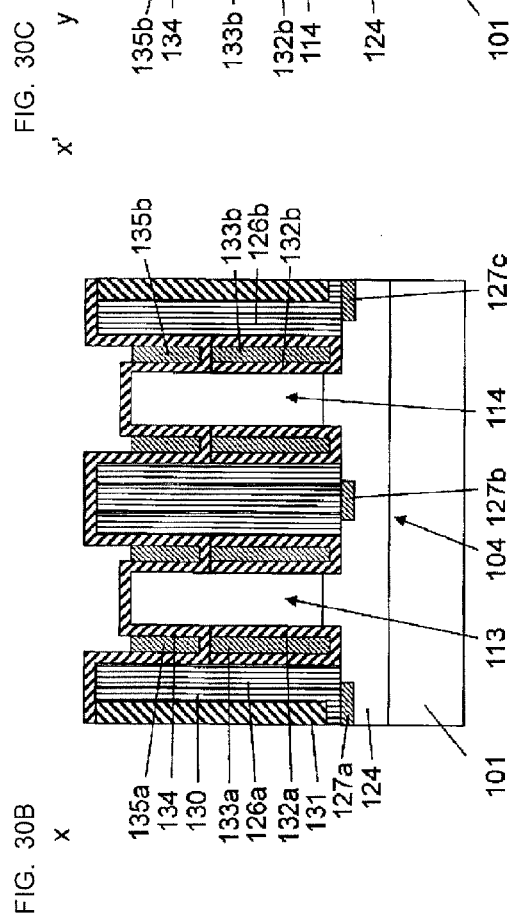
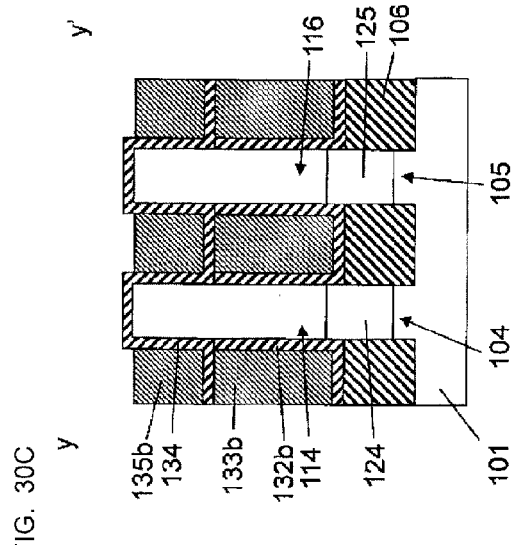
FIG. 30A
FIG. 30B
FIG. 30C

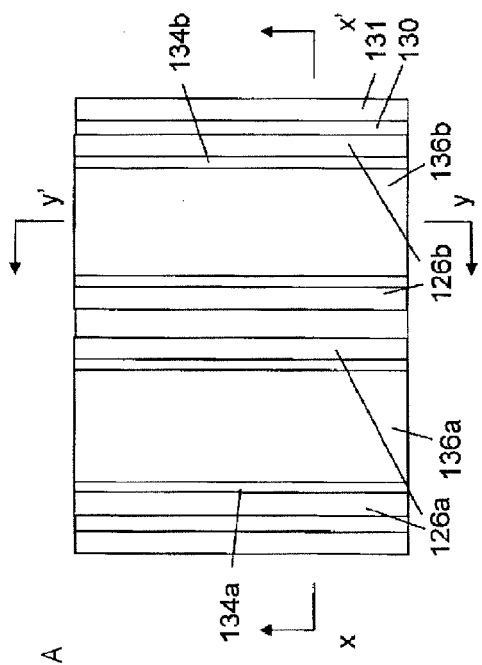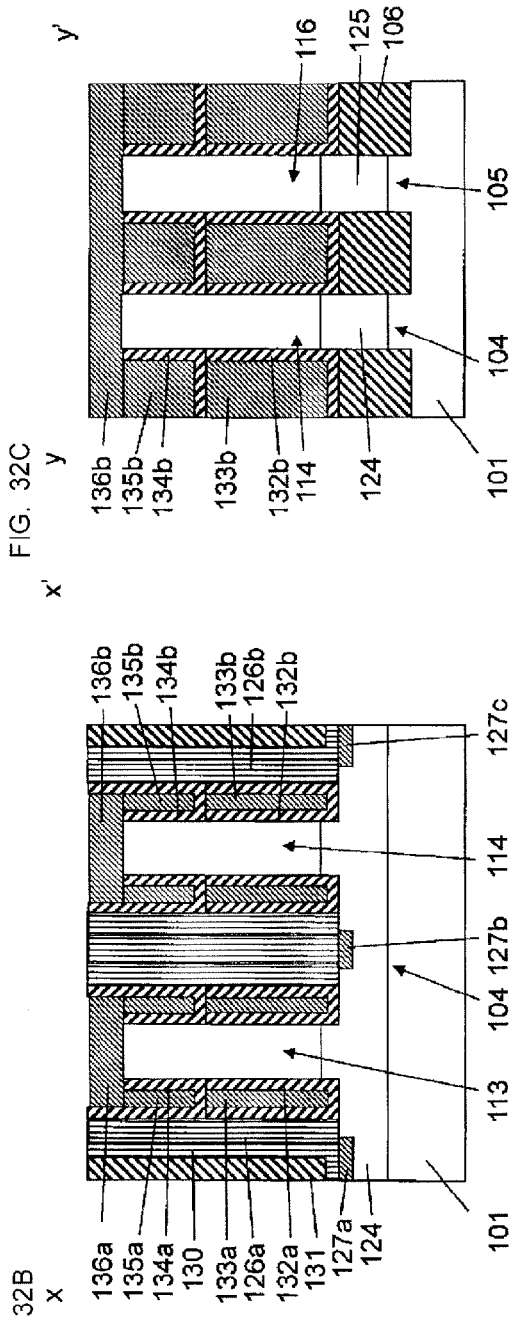
FIG. 32A
FIG. 32B
FIG. 32C

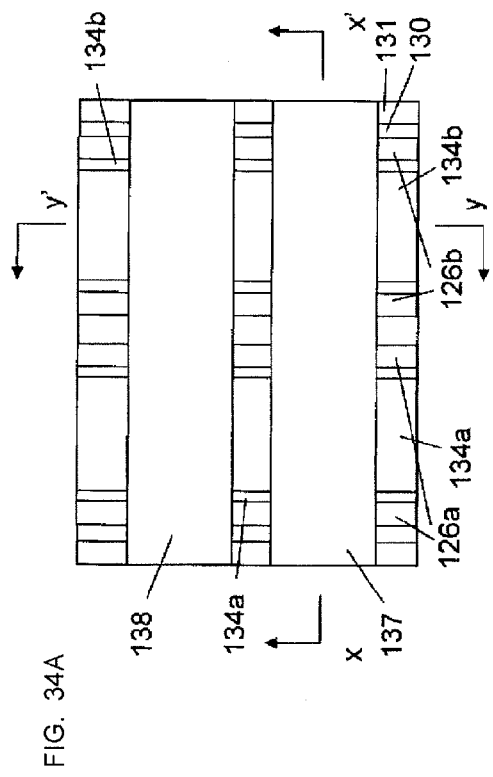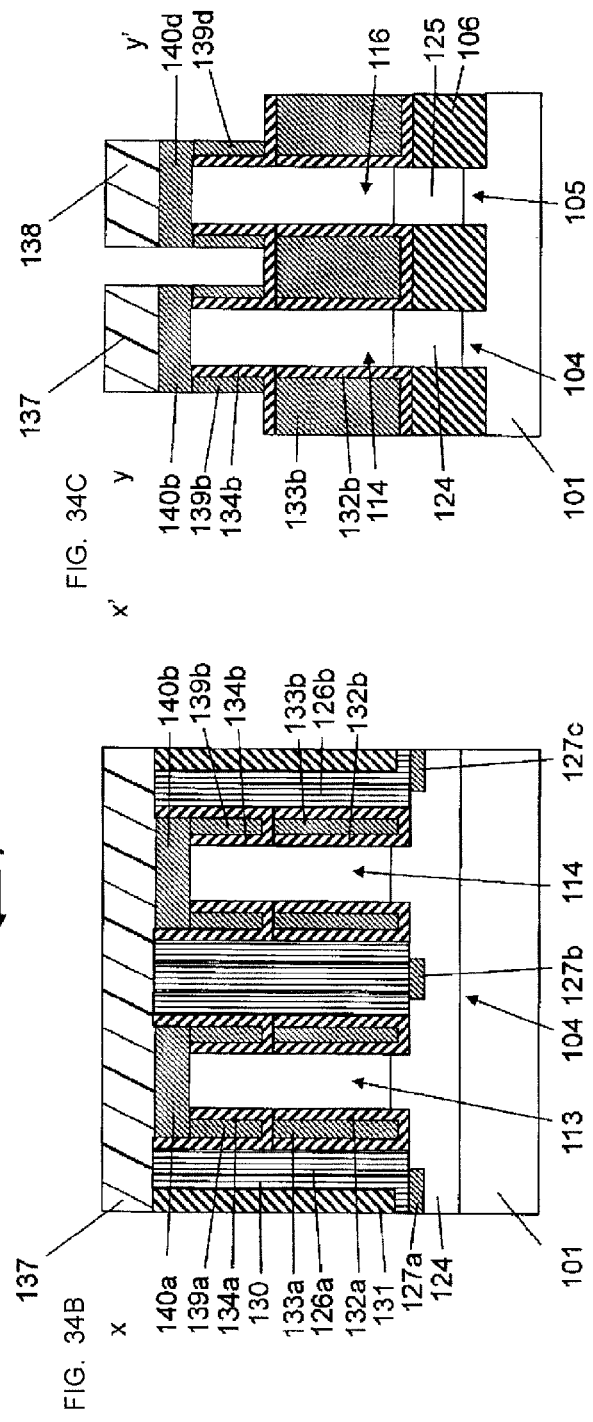
FIG. 34A
FIG. 34B
FIG. 34C

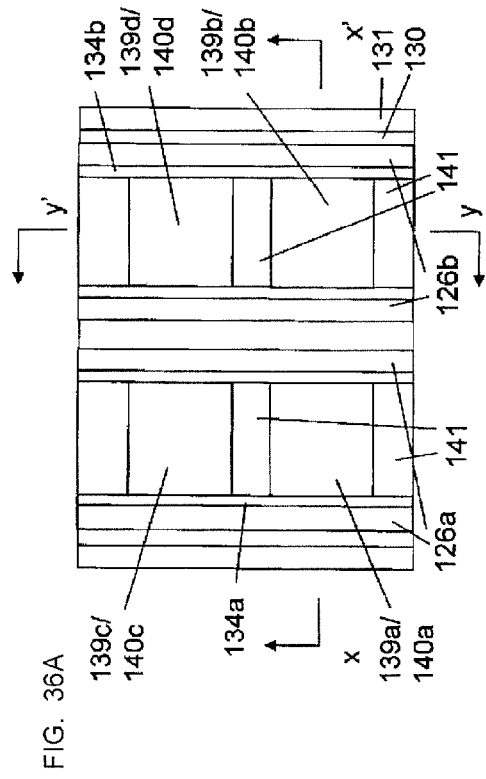
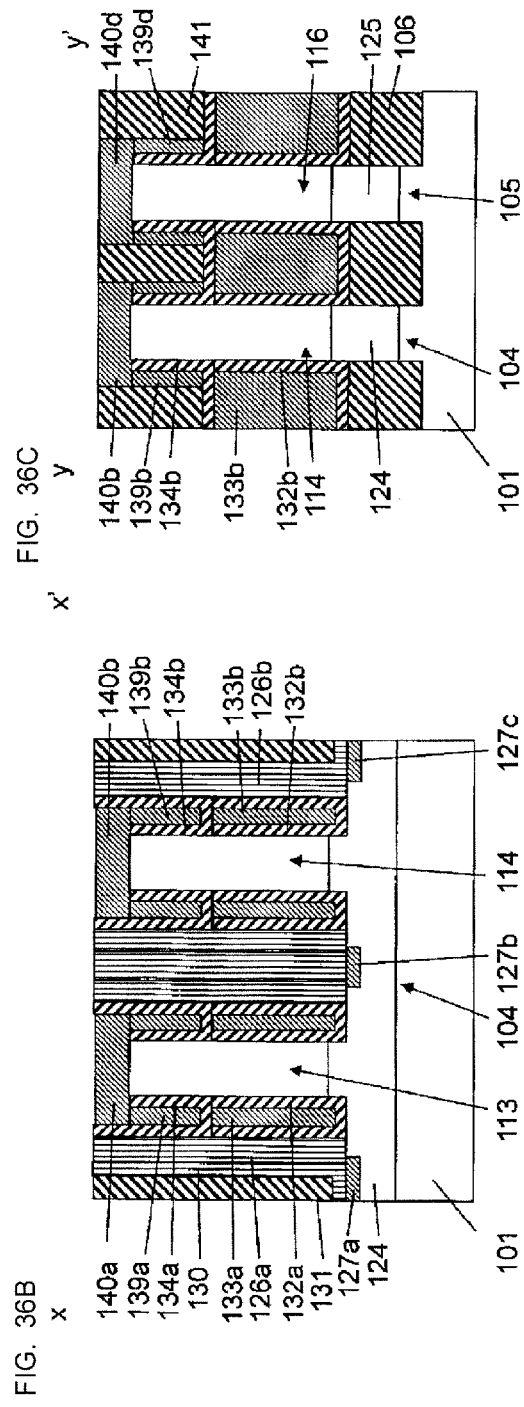
FIG. 36A
FIG. 36B
FIG. 36C

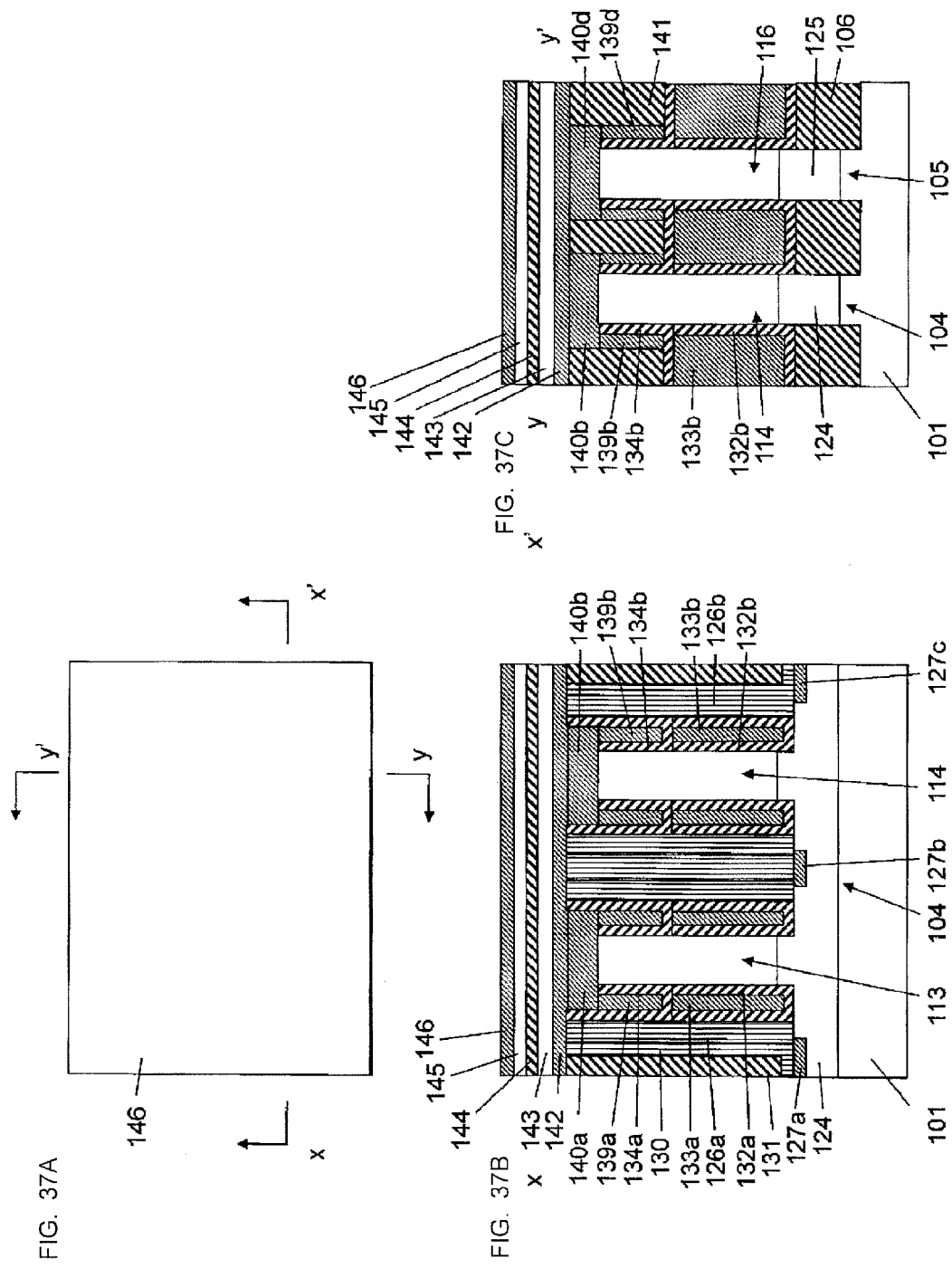

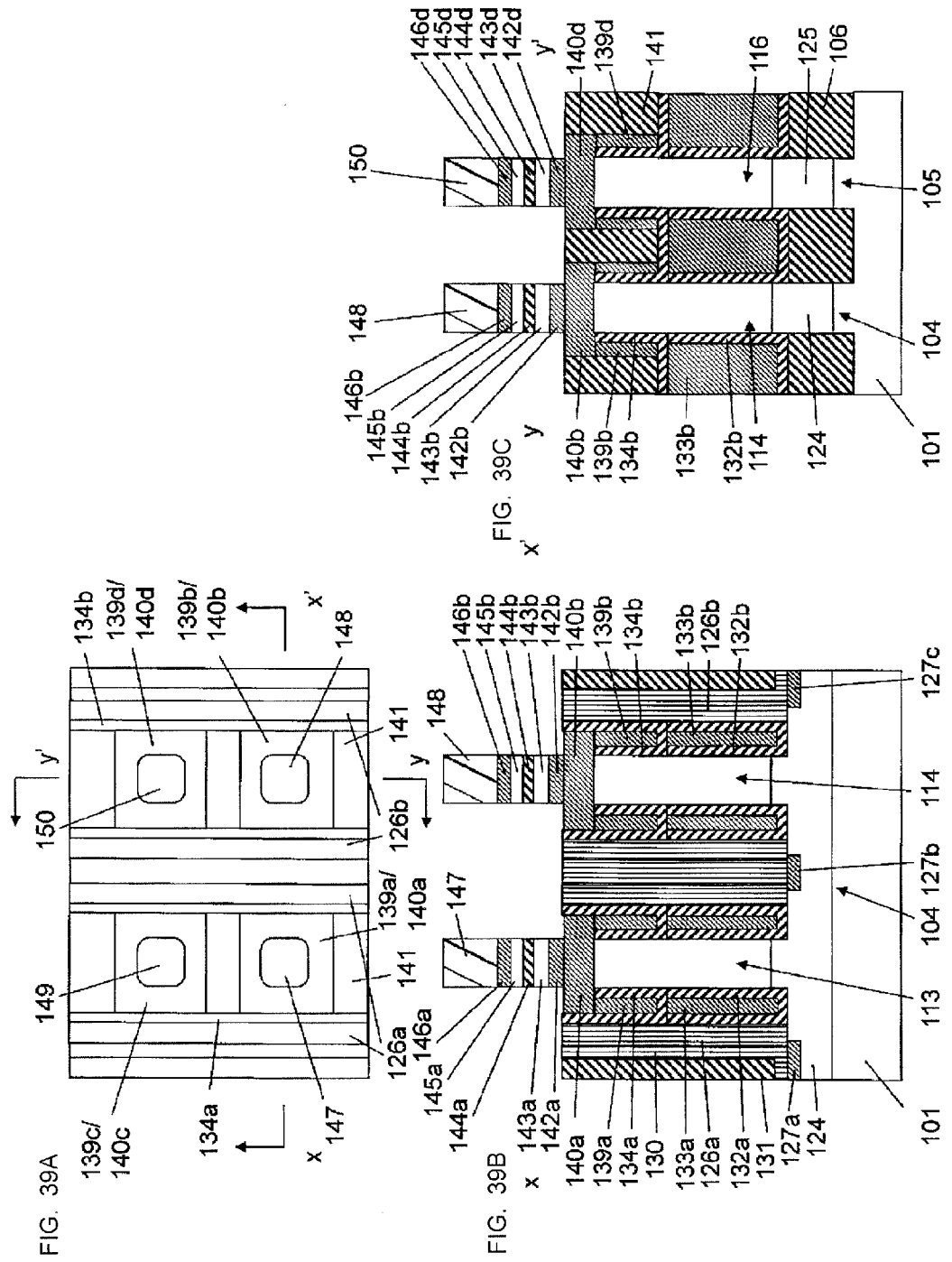

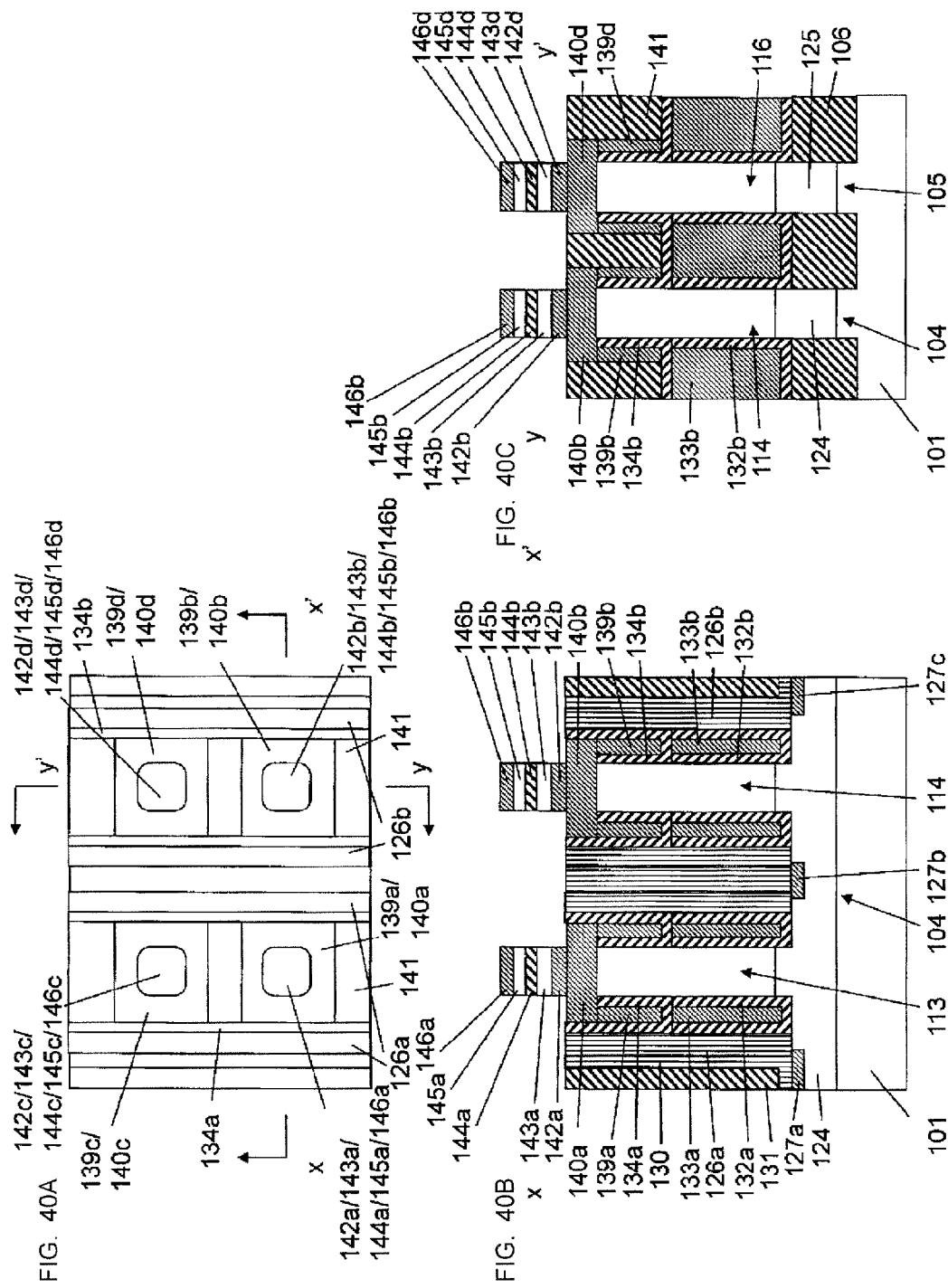

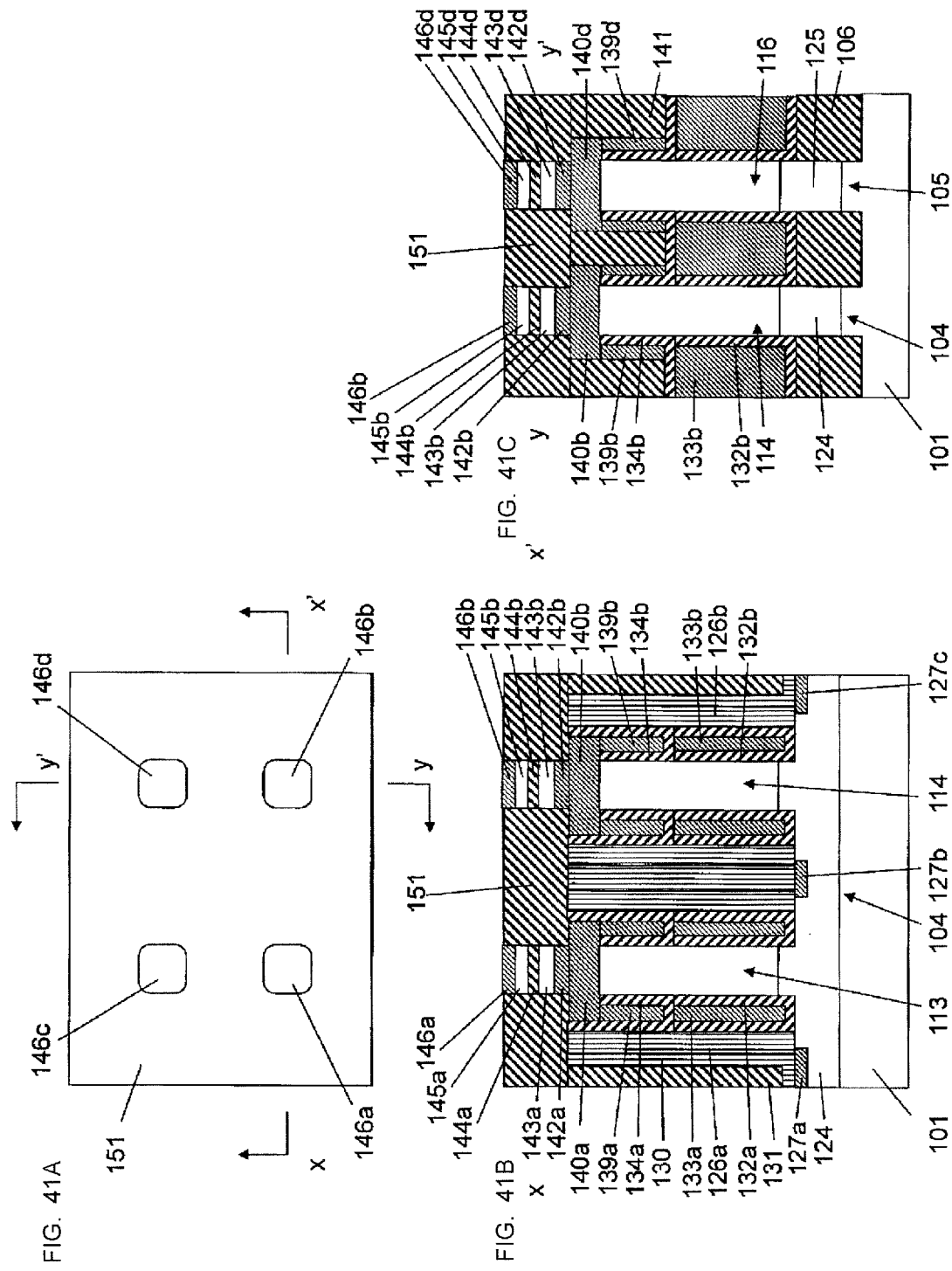

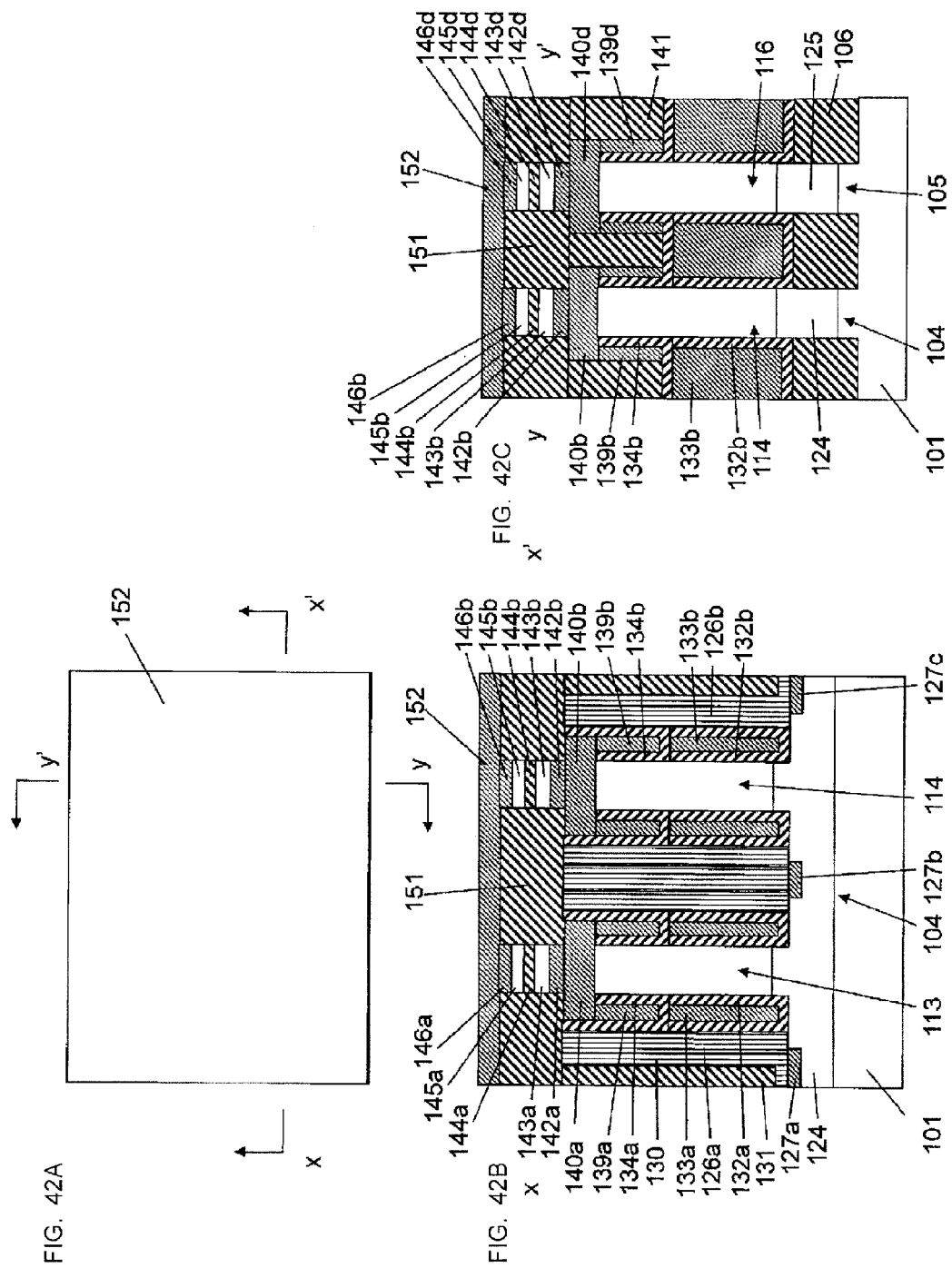

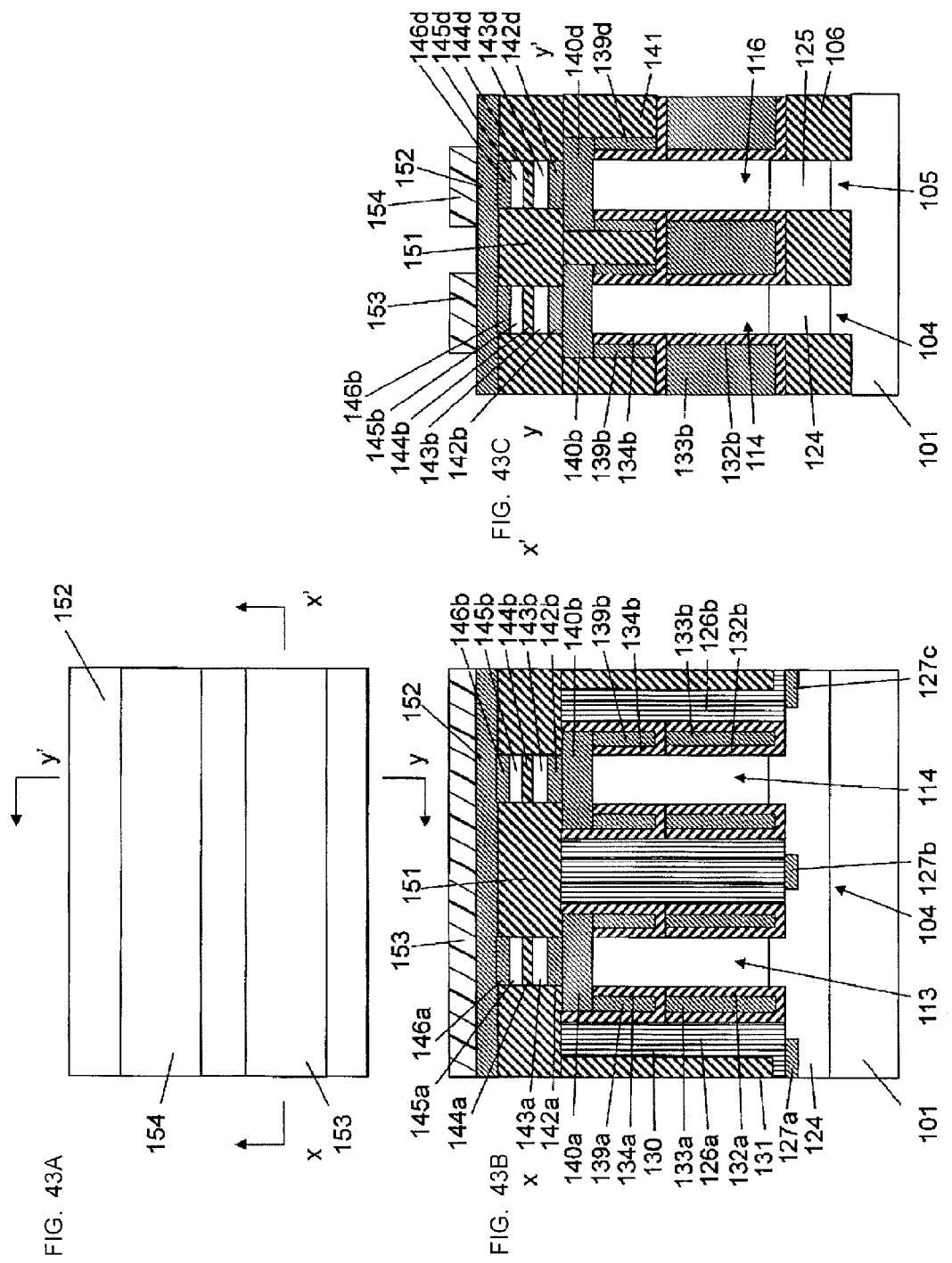

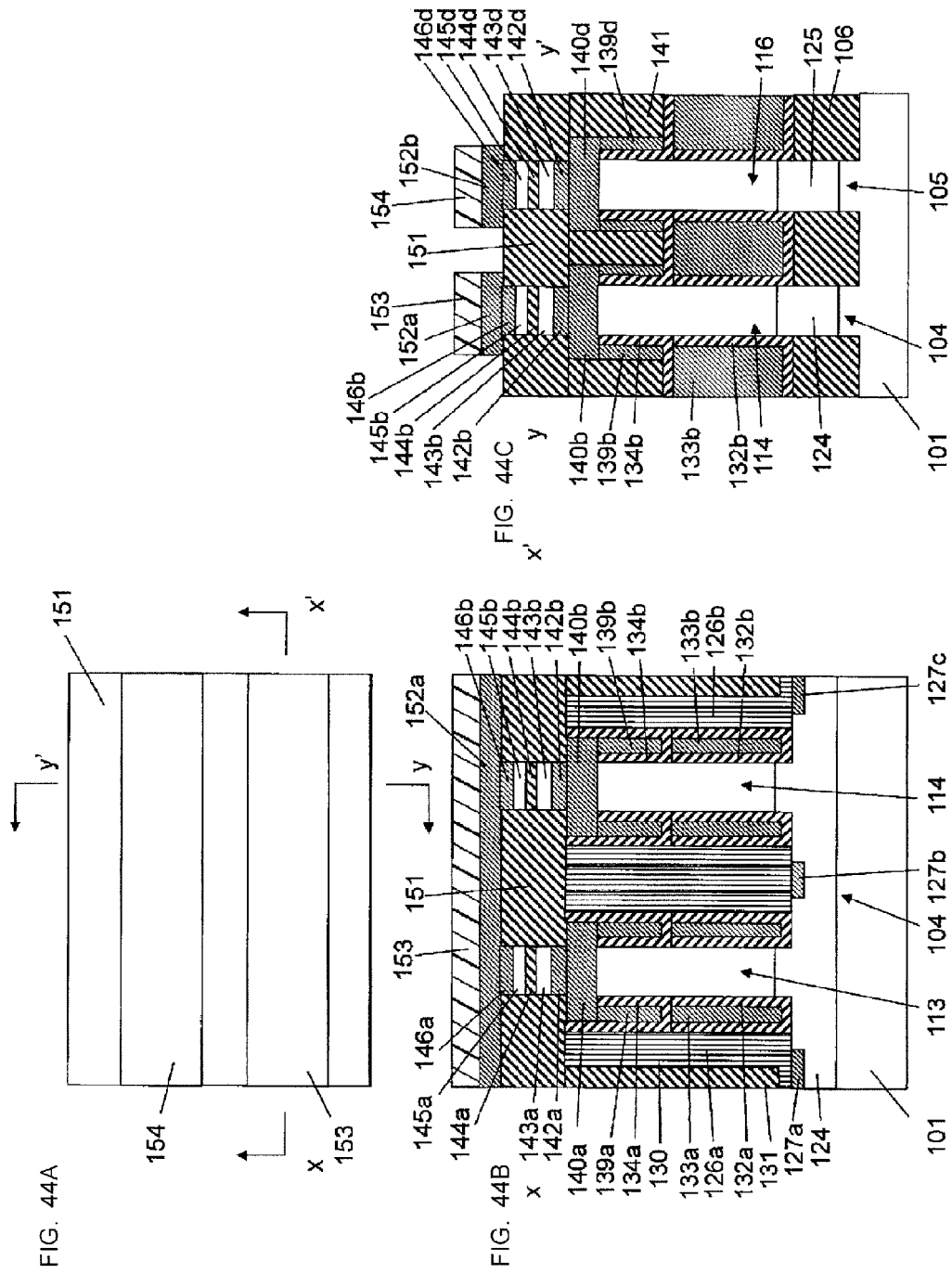

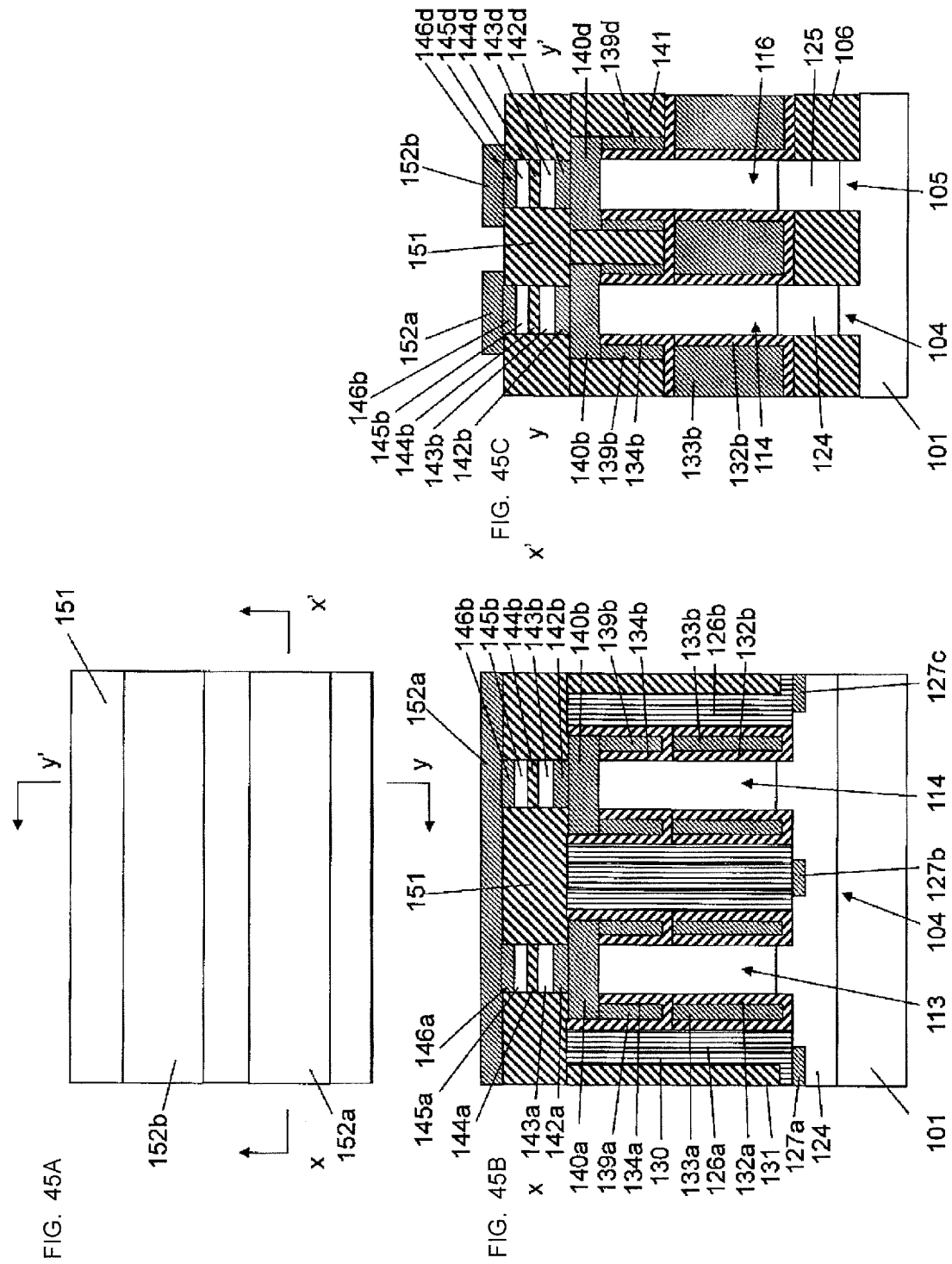

SEMICONDUCTOR DEVICE

RELATED APPLICATIONS

This application is a continuation patent application of U.S. patent application Ser. No. 14/593,659, filed Jan. 9, 2015, which claims priority under 35 U.S.C. §119 to Japanese Patent Application No. 2014-010449 filed on Jan. 23, 2014, the entire content of which are hereby incorporated by reference.

BACKGROUND OF THE INVENTION

1. Field of the Invention

The present invention relates to a semiconductor device and a method for manufacturing a semiconductor device.

2. Description of the Related Art

In recent years, magnetoresistive memories have been developed (for example, see Japanese Unexamined Patent Application Publication No. 2013-93592 (hereinafter referred to as '592 document)).

According to a known structure of a STT-MRAM array such as one shown in FIG. 4A of '592 document, source lines (SL) extend perpendicular to word lines (WL) and parallel to bit lines (BL). When this structure is formed by using planar transistors, an additional metal 1 is needed for source lines as shown in FIG. 4B of '592 document and thus the area used in the bit cell array is increased and the size of the bit cell is increased.

There have been proposals of surrounding gate transistors (hereinafter referred to as SGTs) in which a source, a gate, and a drain are arranged in a direction perpendicular to a substrate and in which a gate electrode surround a pillar-shaped semiconductor layer (for example, see Japanese Unexamined Patent Application Publication No. 2004-356314).

However, since the density of silicon is $5\times10^{22}$ atoms/$cm^3$, it becomes increasingly difficult to introduce an impurity into a silicon pillar as the silicon pillar becomes thinner.

A proposal has been made for existing SGTs that the threshold voltage of a SGT be determined by decreasing the impurity concentration of channel to $10^{17}$ $cm^{-3}$ or less and changing the work function of the gate material (for example, see Japanese Unexamined Patent Application Publication No. 2004-356314).

Another proposal relates to a planar MOS transistor, in which a side wall in a LDD region is formed of polycrystalline silicon having the same conductivity type as the low-concentration layer and surface carriers in LDD region are induced by the difference in work function. As a result, compared to a LDD-type MOS transistor having a side wall formed of an oxide film, the impedance in the LDD region can be decreased (for example, see Japanese Unexamined Patent Application Publication No. 11-297984). According to this document, the polycrystalline silicon side wall is electrically insulated from the gate electrode and figures show that the polycrystalline silicon side wall and the source/drain are insulated from each other by an interlayer insulating film.

SUMMARY OF THE INVENTION

It is desirable to provide a memory structure that includes a magnetic tunnel junction memory element and that can decrease the cell area, and a method for manufacturing such a memory structure.

According to an aspect of the present invention, a semiconductor device includes a first fin-shaped semiconductor layer disposed on a semiconductor substrate, a first insulating film disposed around the first fin-shaped semiconductor layer, a first pillar-shaped semiconductor layer disposed on the first fin-shaped semiconductor layer, a first gate insulating film disposed around the first pillar-shaped semiconductor layer, a first gate line formed around the first gate insulating film and extending in a direction perpendicular to the first fin-shaped semiconductor layer, a second diffusion layer disposed in a lower portion of the first pillar-shaped semiconductor layer, a third gate insulating film surrounding an upper portion of the first pillar-shaped semiconductor layer, a first contact electrode surrounding the third gate insulating film, a second contact electrode that connects an upper portion of the first contact electrode to an upper portion of the first pillar-shaped semiconductor layer, and a first magnetic tunnel junction memory element disposed on the second contact electrode.

The first contact electrode may be composed of a metal having a work function in the range of 4.0 eV to 4.2 eV or in the range of 5.0 eV to 5.2 eV.

The semiconductor device may further include a first bit line that extends in a direction perpendicular to the first gate line and is connected to an upper portion of the first magnetic tunnel junction memory element.

The semiconductor device may further include a second pillar-shaped semiconductor layer disposed on the first fin-shaped semiconductor layer, a second gate insulating film disposed around the second pillar-shaped semiconductor layer, a second gate line disposed around the second gate insulating film and extending in a direction perpendicular to the first fin-shaped semiconductor layer, a fourth gate insulating film surrounding an upper portion of the second pillar-shaped semiconductor layer, a third contact electrode surrounding the fourth gate insulating film, a fourth contact electrode that connects an upper portion of the third contact electrode to an upper portion of the second pillar-shaped semiconductor layer, and a second magnetic tunnel junction memory element disposed on the fourth contact electrode, in which the second diffusion layer is further formed in a lower portion of the second pillar-shaped semiconductor layer and in the first fin-shaped semiconductor layer and functions as a source line.

The first gate line and the second gate line may each be composed of a metal.

The width of the first pillar-shaped semiconductor layer in a direction perpendicular to the first fin-shaped semiconductor layer may be equal to the width of the first fin-shaped semiconductor layer in the direction perpendicular to the first fin-shaped semiconductor layer.

The semiconductor may further include a first gate insulating film around and at a bottom portion of the first gate line.

According to another aspect of the present invention, a method for manufacturing a semiconductor device includes a first step that includes forming first fin-shaped semiconductor layers on a semiconductor substrate and forming a first insulating film around the first fin-shaped semiconductor layers; a second step that includes forming a second insulating film around the first fin-shaped semiconductor layers, depositing a first polysilicon on the second insulating film to perform planarization, forming second resists for forming a first gate line, a second gate line, a first pillar-shaped semiconductor layer, and a second pillar-shaped semiconductor layer, the second resists being formed in a direction perpendicular to the first fin-shaped semiconductor layers, and etching the first polysilicon, the second insulating film, and the first fin-shaped semiconductor layers so as to form first pillar-shaped semiconductor layers, a first dummy gate formed of the first polysilicon, second pillar-shaped semiconductor layers, and a second dummy gate formed of the first polysilicon, the second step being performed after the first step; a third step that includes forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate, the third step being performed after the second step; a fourth step that includes forming second diffusion layers in upper portions of the first fin-shaped semiconductor layers, lower portions of the first pillar-shaped semiconductor layers, and lower portions of the second pillar-shaped semiconductor layers, forming a fifth insulating film around the third dummy gate and the fourth dummy gate, etching the fifth insulating film into a side wall shape so that side walls composed of the fifth insulating film are formed, and forming metal-semiconductor compounds on the second diffusion layers so as to form source lines, the fourth step being performed after the third step; a fifth step that includes depositing an interlayer insulating film to perform planarization, exposing upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film, which will form a first gate insulating film and a second gate insulating film, around the first pillar-shaped semiconductor layers, around the second pillar-shaped semiconductor layers, and on inner sides of the side walls formed of the fifth insulating film, depositing a metal, and etching back the metal to form a first gate line around the first pillar-shaped semiconductor layers and a second gate line around the second pillar-shaped semiconductor layers, the fifth step being performed after the fourth step; a sixth step that includes removing exposed portions of the gate insulating film which will form a first gate insulating film and a second gate insulating film, forming a gate insulating film, which will form a third gate insulating film and a fourth gate insulating film, around upper portions of the first pillar-shaped semiconductor layers, around upper portions of the second pillar-shaped semiconductor layers, and on inner sides of the side walls formed of the fifth insulating film, depositing a metal, etching back the metal to form a first contact electrode line around upper portions of the first pillar-shaped semiconductor layers and a third contact electrode line around the second pillar-shaped semiconductor layers, removing portions of the gate insulating film which will form a third gate insulating film and a fourth gate insulating film, the portions being exposed on the first pillar-shaped semiconductor layers and the second pillar-shaped semiconductor layers, depositing a metal, etching back the metal so as to form a second contact electrode line and a fourth contact electrode line, and etching the first contact electrode line, the second contact electrode line, the third contact electrode line, and the fourth contact electrode line to form first contact electrodes, second contact electrodes, third contact electrodes, and fourth contact electrodes, the sixth step being performed after the fifth step; and a seventh step that includes depositing a second interlayer insulating film to perform planarization, exposing upper portions of the second contact electrodes and upper portions of the fourth contact electrodes, and forming first magnetic tunnel junction memory elements on the second contact electrodes and second magnetic tunnel junction memory elements on the fourth contact electrodes, the seventh step being performed after the sixth step.

The second step may further include forming a third insulating film on the first polysilicon after the first polysilicon is deposited on the second insulating film to perform planarization.

The present invention can provide a memory structure having a magnetic tunnel junction memory element and a method for manufacturing the memory structure in which the cell area is decreased by using pillar-shaped semiconductor layers.

When a semiconductor device that includes a first pillar-shaped semiconductor layer, a first gate insulating film disposed around the first pillar-shaped semiconductor layer, a first gate line formed around the first gate insulating film, and a first magnetic tunnel junction memory element formed on the first pillar-shaped semiconductor layer is used, the cell area can be decreased and the source lines can be formed at a level different from that of the bit lines.

Moreover, the first insulating film can isolate adjacent fin-shaped semiconductor layers from each other, the sources of the individual memory cells can be connected to each other by using the second diffusion layers formed in the first fin-shaped semiconductor layer, and the second diffusion layers can function as source lines. In other words, in a memory having a magnetic tunnel junction memory element, source lines can be formed at a level different from that of the bit lines, the source lines and bit lines can be formed to be parallel to each other, and the cell area can be decreased.

No diffusion layers are formed in upper portions of the pillar-shaped semiconductor layers and thus the upper portions of the pillar-shaped semiconductor layers can function as n-type semiconductor layers or p-type semiconductor layers depending on the difference in work function between the metal and the semiconductor. Accordingly, the step of forming diffusion layers in upper portions of the pillar-shaped semiconductor layers can be omitted.

When the first gate line and the second gate line are each composed of a metal, high-speed operation can be achieved.

When the width of the first pillar-shaped semiconductor layer in a direction perpendicular to the first fin-shaped semiconductor layer is equal to the width of the first fin-shaped semiconductor layer in the direction perpendicular to the first fin-shaped semiconductor layer, the fin-shaped semiconductor layers, the pillar-shaped semiconductor layers, and the gate lines can be formed by using two masks perpendicular to each other. Thus, misalignment can be avoided.

When the first gate insulating film is disposed around and at a bottom portion of the first gate line, the semiconductor device can be formed by a gate-last technology. Thus, insulation between the gate lines and the fin-shaped semiconductor layers can be ensured.

BRIEF DESCRIPTION OF THE DRAWINGS

FIG. 1A is a plan view of a semiconductor device according to one embodiment, FIG. 1B is a cross-sectional view taken at line X-X' in FIG. 1A, and FIG. 1C is a cross-sectional view taken at line Y-Y' in FIG. 1A.

FIG. 2A is a plan view related to a method for manufacturing a semiconductor device according to one embodiment, FIG. 2B is a cross-sectional view taken at line X-X' in FIG. 2A, and FIG. 2C is a cross-sectional view taken at line Y-Y' in FIG. 2A.

FIG. 9A is a plan view related to the method for manufacturing a semiconductor device according to one embodiment, FIG. 9B is a cross-sectional view taken at line X-X' in FIG. 9A, and FIG. 9C is a cross-sectional view taken at line Y-Y' in FIG. 9A.

FIG. 10A is a plan view related to the method for manufacturing a semiconductor device according to one embodiment, FIG. 10B is a cross-sectional view taken at line X-X' in FIG. 10A, and FIG. 10C is a cross-sectional view taken at line Y-Y' in FIG. 10A.

FIG. 11A is a plan view related to the method for manufacturing a semiconductor device according to one embodiment, FIG. 11B is a cross-sectional view taken at line X-X' in FIG. 11A, and FIG. 11C is a cross-sectional view taken at line Y-Y' in FIG. 11A.

FIG. 12A is a plan view related to the method for manufacturing a semiconductor device according to one embodiment, FIG. 12B is a cross-sectional view taken at line X-X' in FIG. 12A, and FIG. 12C is a cross-sectional view taken at line Y-Y' in FIG. 12A.

FIG. 14A is a plan view related to the method for manufacturing a semiconductor device according to one embodiment, FIG. 14B is a cross-sectional view taken at line X-X' in FIG. 14A, and FIG. 14C is a cross-sectional view taken at line Y-Y' in FIG. 14A.

FIG. 17A is a plan view related to the method for manufacturing a semiconductor device according to one embodiment, FIG. 17B is a cross-sectional view taken at line X-X' in FIG. 17A, and FIG. 17C is a cross-sectional view taken at line Y-Y' in FIG. 17A.

FIG. 18A is a plan view related to the method for manufacturing a semiconductor device according to one embodiment, FIG. 18B is a cross-sectional view taken at line X-X' in FIG. 18A, and FIG. 18C is a cross-sectional view taken at line Y-Y' in FIG. 18A.

FIG. 19A is a plan view related to the method for manufacturing a semiconductor device according to one embodiment, FIG. 19B is a cross-sectional view taken at line X-X' in FIG. 19A, and FIG. 19C is a cross-sectional view taken at line Y-Y' in FIG. 19A.

FIG. 20A is a plan view related to the method for manufacturing a semiconductor device according to one embodiment, FIG. 20B is a cross-sectional view taken at line X-X' in FIG. 20A, and FIG. 20C is a cross-sectional view taken at line Y-Y' in FIG. 20A.

FIG. 23A is a plan view related to the method for manufacturing a semiconductor device according to one embodiment, FIG. 23B is a cross-sectional view taken at line X-X' in FIG. 23A, and FIG. 23C is a cross-sectional view taken at line Y-Y' in FIG. 23A.

FIG. 24A is a plan view related to the method for manufacturing a semiconductor device according to one embodiment, FIG. 24B is a cross-sectional view taken at line X-X' in FIG. 24A, and FIG. 24C is a cross-sectional view taken at line Y-Y' in FIG. 24A.

FIG. 26A is a plan view related to the method for manufacturing a semiconductor device according to one embodiment, FIG. 26B is a cross-sectional view taken at line X-X' in FIG. 26A, and FIG. 26C is a cross-sectional view taken at line Y-Y' in FIG. 26A.

FIG. 28A is a plan view related to the method for manufacturing a semiconductor device according to one embodiment, FIG. 28B is a cross-sectional view taken at line X-X' in FIG. 28A, and FIG. 28C is a cross-sectional view taken at line Y-Y' in FIG. 28A.

FIG. 29A is a plan view related to the method for manufacturing a semiconductor device according to one embodiment, FIG. 29B is a cross-sectional view taken at line X-X' in FIG. 29A, and FIG. 29C is a cross-sectional view taken at line Y-Y' in FIG. 29A.

FIG. 30A is a plan view related to the method for manufacturing a semiconductor device according to one embodiment, FIG. 30B is a cross-sectional view taken at line X-X' in FIG. 30A, and FIG. 30C is a cross-sectional view taken at line Y-Y' in FIG. 30A.

FIG. 32A is a plan view related to the method for manufacturing a semiconductor device according to one embodiment, FIG. 32B is a cross-sectional view taken at line X-X' in FIG. 32A, and FIG. 32C is a cross-sectional view taken at line Y-Y' in FIG. 32A.

FIG. 34A is a plan view related to the method for manufacturing a semiconductor device according to one embodiment, FIG. 34B is a cross-sectional view taken at line X-X' in FIG. 34A, and FIG. 34C is a cross-sectional view taken at line Y-Y' in FIG. 34A.

FIG. 36A is a plan view related to the method for manufacturing a semiconductor device according to one embodiment, FIG. 36B is a cross-sectional view taken at line X-X' in FIG. 36A, and FIG. 36C is a cross-sectional view taken at line Y-Y' in FIG. 36A.

FIG. 37A is a plan view related to the method for manufacturing a semiconductor device according to one embodiment, FIG. 37B is a cross-sectional view taken at line X-X' in FIG. 37A, and FIG. 37C is a cross-sectional view taken at line Y-Y' in FIG. 37A.

FIG. 39A is a plan view related to the method for manufacturing a semiconductor device according to one embodiment, FIG. 39B is a cross-sectional view taken at line X-X' in FIG. 39A, and FIG. 39C is a cross-sectional view taken at line Y-Y' in FIG. 39A.

FIG. 40A is a plan view related to the method for manufacturing a semiconductor device according to one embodiment, FIG. 40B is a cross-sectional view taken at line X-X' in FIG. 40A, and FIG. 40C is a cross-sectional view taken at line Y-Y' in FIG. 40A.

FIG. 41A is a plan view related to the method for manufacturing a semiconductor device according to one embodiment, FIG. 41B is a cross-sectional view taken at line X-X' in FIG. 41A, and FIG. 41C is a cross-sectional view taken at line Y-Y' in FIG. 41A.

FIG. 42A is a plan view related to the method for manufacturing a semiconductor device according to one embodiment, FIG. 42B is a cross-sectional view taken at line X-X' in FIG. 42A, and FIG. 42C is a cross-sectional view taken at line Y-Y' in FIG. 42A.

FIG. 43A is a plan view related to the method for manufacturing a semiconductor device according to one embodiment, FIG. 43B is a cross-sectional view taken at line X-X' in FIG. 43A, and FIG. 43C is a cross-sectional view taken at line Y-Y' in FIG. 43A.

FIG. 44A is a plan view related to the method for manufacturing a semiconductor device according to one embodiment, FIG. 44B is a cross-sectional view taken at line X-X' in FIG. 44A, and FIG. 44C is a cross-sectional view taken at line Y-Y' in FIG. 44A.

FIG. 45A is a plan view related to the method for manufacturing a semiconductor device according to one embodiment, FIG. 45B is a cross-sectional view taken at line X-X' in FIG. 45A, and FIG. 45C is a cross-sectional view taken at line Y-Y' in FIG. 45A.

DETAILED DESCRIPTION OF THE PREFERRED EMBODIMENTS

Figure 3A:
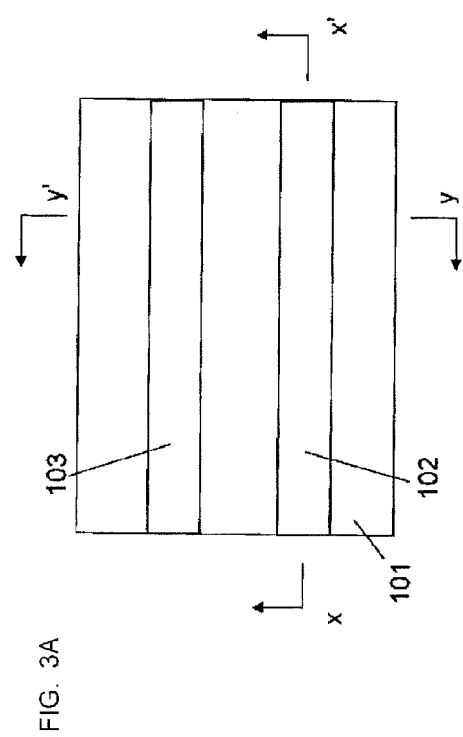
FIG. 3A is a plan view related to the method for manufacturing a semiconductor device according to one embodiment.

Embodiments of the present invention will now be described with reference to drawings. FIGS. 1A to 1C show a structure of a semiconductor device according to an embodiment of the present invention.

A memory cell on the lower left side of FIG. 1A includes a first fin-shaped semiconductor layer 104 disposed on a semiconductor substrate 101, a first insulating film 106 disposed around the first fin-shaped semiconductor layer 104, a first pillar-shaped semiconductor layer 113 disposed on the first fin-shaped semiconductor layer 104, a first gate insulating film 132a disposed around the first pillar-shaped semiconductor layer 113, a first gate line 133a that is disposed around the first gate insulating film 132a and extends in a direction perpendicular to the first fin-shaped semiconductor layer 104, a second diffusion layer 124 formed in a lower portion of the first pillar-shaped semiconductor layer 113, a third gate insulating film 134a surrounding an upper portion of the first pillar-shaped semiconductor layer 113, a first contact electrode 139a surrounding the third gate insulating film 134a, a second contact electrode 140a that connects an upper portion of the first contact electrode 139a to an upper portion of the first pillar-shaped semiconductor layer 113, and a first magnetic tunnel junction memory element (143a, 144a, and 145a) disposed on the second contact electrode 140a.

The first magnetic tunnel junction memory element includes a pinned phase 143a, a tunnel barrier layer 144a, and a free layer 145a. A lower electrode 142a is disposed between the pinned phase 143a and the second contact electrode 140a. An upper electrode 146a is disposed on the free layer 145a.

The first contact electrode 139a is composed of metal. The work function of the metal of the first contact electrode 139a is in the range of 4.0 eV to 4.2 eV when the metal functions as an n-type semiconductor or in the range of 5.0 eV to 5.2 eV when the metal functions as a p-type semiconductor.

The metal of the first contact electrode 139a may be the same as the metal of the second contact electrode 140a.

A first bit line 152a that extends in a direction perpendicular to the first gate line 133a is connected to an upper portion of the first magnetic tunnel junction memory element (143a, 144a, and 145a).

A memory cell on the lower right side of FIG. 1A includes a second pillar-shaped semiconductor layer 114 disposed on the first fin-shaped semiconductor layer 104, a second gate insulating film 132b disposed around the second pillar-shaped semiconductor layer 114, a second gate line 133b disposed around the second gate insulating film 132b and extending in a direction perpendicular to the first fin-shaped semiconductor layer 104, the second diffusion layer 124 formed in a lower portion of the second pillar-shaped semiconductor layer 114, a fourth gate insulating film 134b surrounding an upper portion of the second pillar-shaped semiconductor layer 114, a third contact electrode 139b surrounding the fourth gate insulating film 134b, a fourth contact electrode 140b that connects an upper portion of the third contact electrode 139b to an upper portion of the second pillar-shaped semiconductor layer 114, and a second magnetic tunnel junction memory element (143b, 144b, and 145b) on the fourth contact electrode 140b.

The second magnetic tunnel junction memory element includes a pinned phase 143b, a tunnel barrier layer 144b, and a free layer 145b. A lower electrode 142b is disposed between the pinned phase 143b and the fourth contact electrode 140b. An upper electrode 146b is disposed on the free layer 145b.

The first bit line 152a that extends in a direction perpendicular to the second gate line 133b is connected to an upper portion of the second magnetic tunnel junction memory element (143b, 144b, and 145b).

The second diffusion layer 124 is also formed in the first fin-shaped semiconductor layer 104 and functions as a source line.

The first gate line 133a and the second gate line 133b are preferably composed of metal.

A memory cell on the upper left side of FIG. 1A includes a first fin-shaped semiconductor layer 105 disposed on the semiconductor substrate 101, a first insulating film 106 disposed around the first fin-shaped semiconductor layer 105, a first pillar-shaped semiconductor layer 115 disposed on the first fin-shaped semiconductor layer 105, a first gate insulating film 132a disposed around the first pillar-shaped semiconductor layer 115, the first gate line 133a disposed around the first gate insulating film 132a and extending in a direction perpendicular to the first fin-shaped semiconductor layer 105, a second diffusion layer 125 formed in a lower portion of the first pillar-shaped semiconductor layer 115, the third gate insulating film 134a surrounding an upper portion of the first pillar-shaped semiconductor layer 115, a first contact electrode 139c surrounding the third gate insulating film 134a, a second contact electrode 140c that connects an upper portion of the first contact electrode 139c to an upper portion of the first pillar-shaped semiconductor layer 115, and a first magnetic tunnel junction memory element (143c, 144c, and 145c) disposed on the second contact electrode 140c.

The first magnetic tunnel junction memory element includes a pinned phase 143c, a tunnel barrier layer 144c, and a free layer 145c. A lower electrode 142c is disposed between the pinned phase 143c and the second contact electrode 140c. An upper electrode 146c is disposed on the free layer 145c.

A first bit line 152b that extends in a direction perpendicular to the first gate line 133a is connected to an upper portion of the first magnetic tunnel junction memory element (143c, 144c, and 145c).

A memory cell on the upper right side of FIG. 1A includes a second pillar-shaped semiconductor layer 116 disposed on the first fin-shaped semiconductor layer 105, a second gate insulating film 132b disposed around the second pillar-shaped semiconductor layer 116, the second gate line 133b disposed around the second gate insulating film 132b and extending in a direction perpendicular to the first fin-shaped semiconductor layer 105, the second diffusion layer 125 formed in a lower portion of the second pillar-shaped semiconductor layer 116, a fourth gate insulating film 134b surrounding an upper portion of the second pillar-shaped semiconductor layer 116, a third contact electrode 139d surrounding the fourth gate insulating film 134b, a fourth contact electrode 140d connecting an upper portion of the third contact electrode 139d to an upper portion of the second pillar-shaped semiconductor layer 116, and a second magnetic tunnel junction memory element (143d, 144d, and 145d) disposed on the fourth contact electrode 140d.

The second magnetic tunnel junction memory element includes a pinned phase 143d, a tunnel barrier layer 144d, and a free layer 145d. A lower electrode 142d is disposed between the pinned phase 143d and the fourth contact electrode 140d. An upper electrode 146d is disposed on the free layer 145d.

The first bit line 152b extending in a direction perpendicular to the second gate line 133b is connected to an upper portion of the second magnetic tunnel junction memory element (143d, 144d, and 145d).

The second diffusion layer 125 is also formed in the first fin-shaped semiconductor layer 105 and functions as a source line.

A manufacturing process for forming a structure of a semiconductor device according to an embodiment of the present invention will now be described with reference to FIGS. 2A to 45C.

First, a first step that includes forming first fin-shaped semiconductor layers on a semiconductor substrate and forming a first insulating film around the first fin-shaped semiconductor layers is described. In this embodiment, a silicon substrate is used as a semiconductor substrate but the semiconductor substrate is not limited to a silicon substrate and may be any other semiconductor substrate.

Referring to FIGS. 2A to 2C, a first resist 102 and a first resist 103 for forming fin-shaped silicon layers are formed on a silicon substrate 101.

Figure 3C:
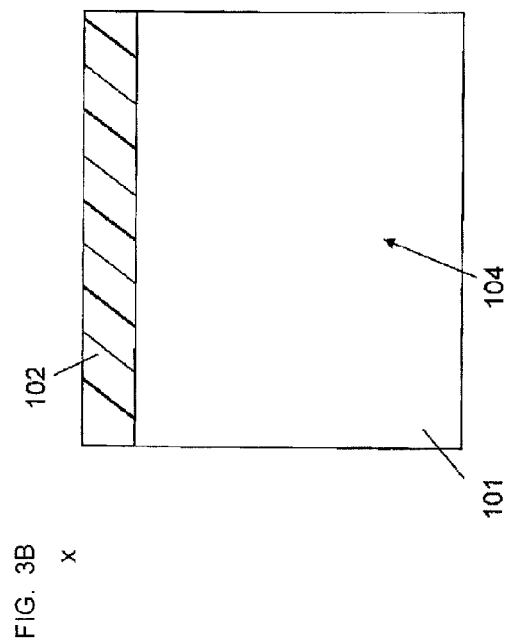
FIG. 3C is a cross-sectional view taken at line Y-Y' in FIG. 3A.
Figure 3B:
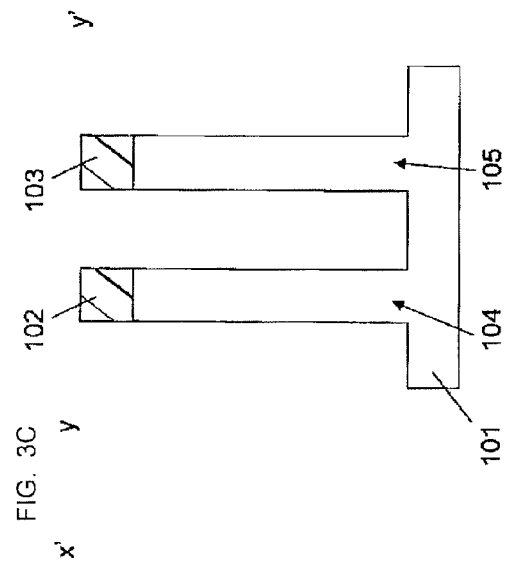
FIG. 3B is a cross-sectional view taken at line X-X' in FIG. 3A.

Referring to FIGS. 3A to 3C, the silicon substrate 101 is etched to form a first fin-shaped silicon layer 104 and a first fin-shaped silicon layer 105. In this embodiment, a resist is used as a mask to form a fin-shaped silicon layer. Alternatively, a hard mask such as an oxide film or a nitride film may be used form a fin-shaped silicon layer.

Figure 4A:
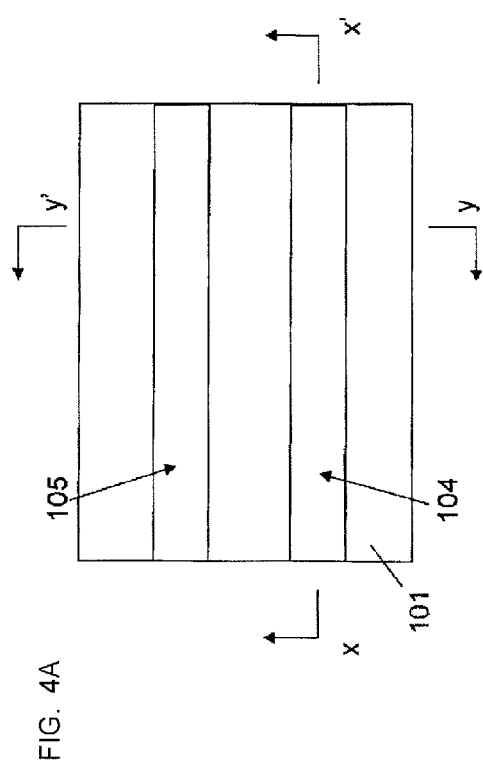
FIG. 4A is a plan view related to the method for manufacturing a semiconductor device according to one embodiment.
Figure 4C:
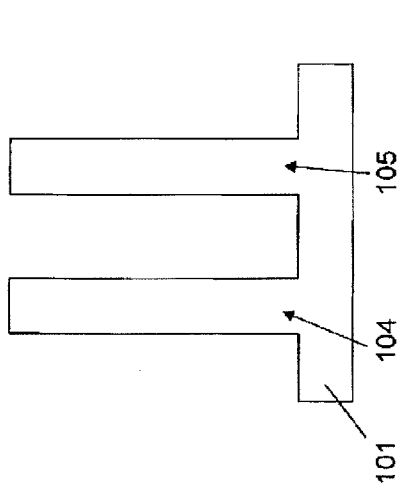
FIG. 4C is a cross-sectional view taken at line Y-Y' in FIG. 4A.
Figure 4B:
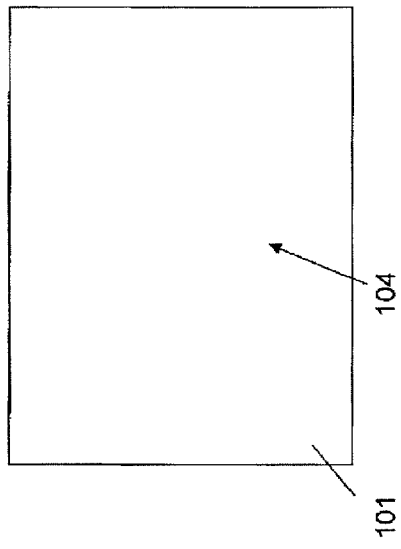
FIG. 4B is a cross-sectional view taken at line X-X' in FIG. 4A.

Referring to FIGS. 4A to 4C, the first resists 102 and 103 are removed.

Figure 5C:
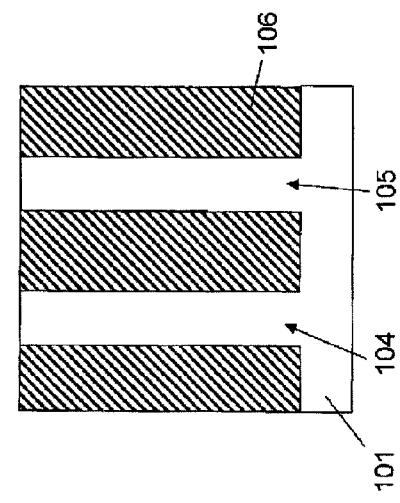
FIG. 5C is a cross-sectional view taken at line Y-Y' in FIG. 5A.
Figure 5A:
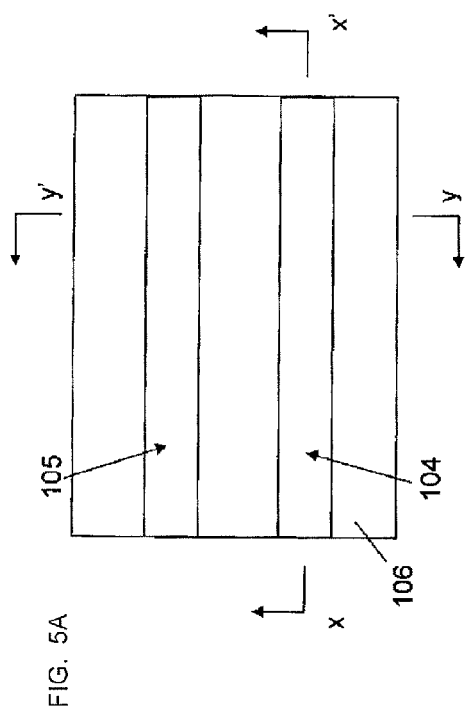
FIG. 5A is a plan view related to the method for manufacturing a semiconductor device according to one embodiment.
Figure 5B:
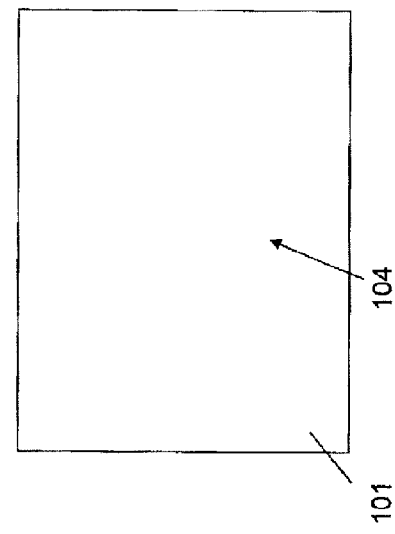
FIG. 5B is a cross-sectional view taken at line X-X' in FIG. 5A.

Referring to FIGS. 5A to 5C, a first insulating layer 106 is deposited around the first fin-shaped silicon layers 104 and 105. An oxide film formed by using high-density plasma or by low-pressure chemical vapor deposition (CVD) may be used as the first insulating film 106.

Figure 6C:
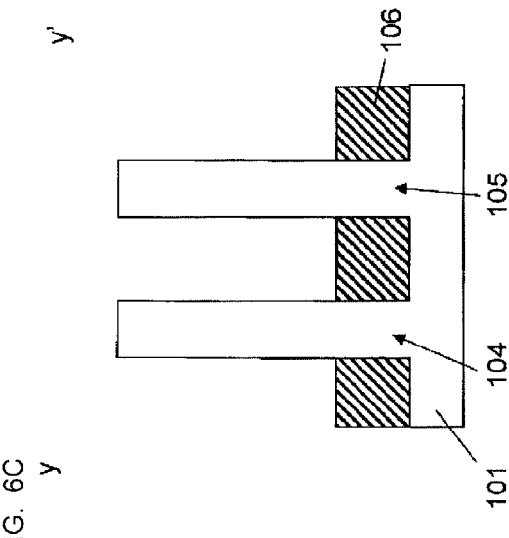
FIG. 6C is a cross-sectional view taken at line Y-Y' in FIG. 6A.
Figure 6A:
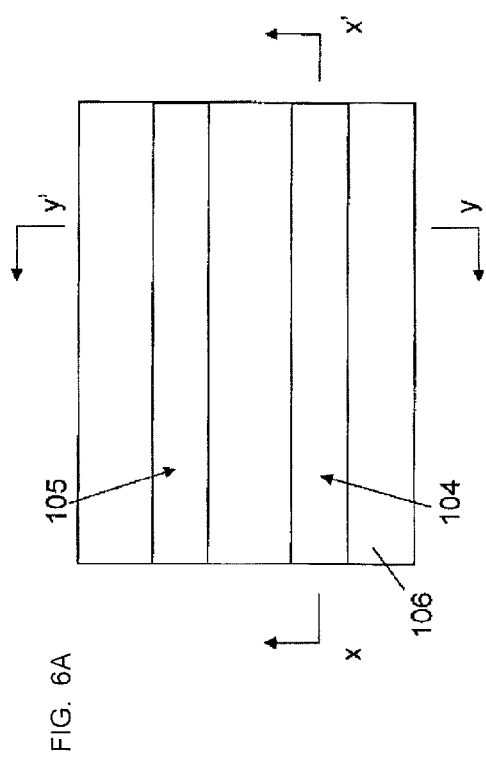
FIG. 6A is a plan view related to the method for manufacturing a semiconductor device according to one embodiment.
Figure 6B:
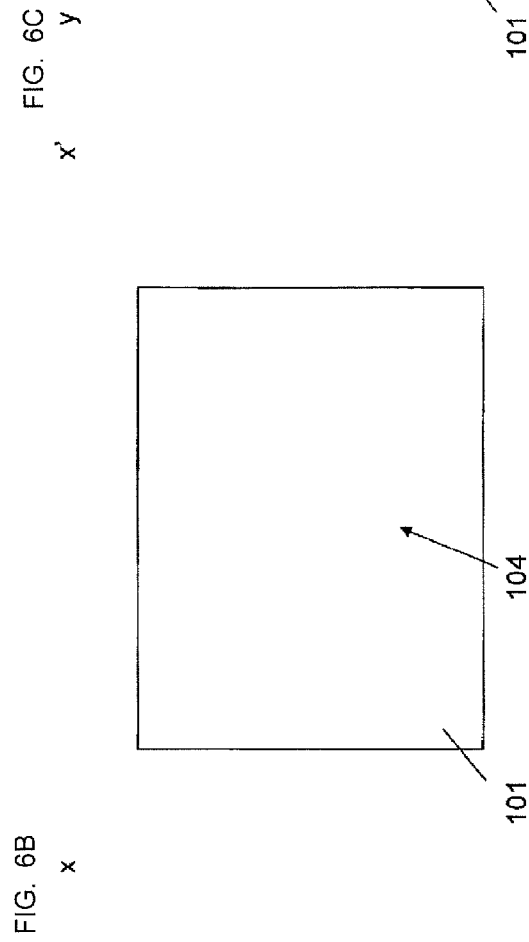
FIG. 6B is a cross-sectional view taken at line X-X' in FIG. 6A.

Referring to FIGS. 6A to 6C, the first insulating film 106 is etched-back to expose upper portions of the first fin-shaped silicon layers 104 and 105.

The description up to the preceding paragraph is the description of the first step that includes forming first fin-shaped semiconductor layers on a semiconductor substrate and forming a first insulating film around the first fin-shaped semiconductor layers.

Described next is a second step that includes forming a second insulating film around the first fin-shaped semiconductor layers, depositing a first polysilicon on the second insulating film to planarize a surface, forming second resists for forming a first gate line, a second gate line, a first pillar-shaped semiconductor layer, and a second pillar-shaped semiconductor layer, the second resists being formed in a direction perpendicular to the first fin-shaped semiconductor layers, and etching the first polysilicon, the second insulating film, and the first fin-shaped semiconductor layers so as to form first pillar-shaped semiconductor layers, a first dummy gate formed of the first polysilicon, second pillar-shaped semiconductor layers, and a second dummy gate formed of the first polysilicon.

Figure 7C:
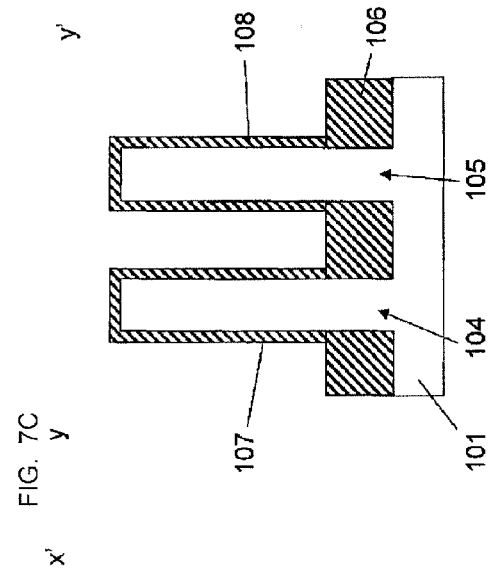
FIG. 7C is a cross-sectional view taken at line Y-Y' in FIG. 7A.
Figure 7A:
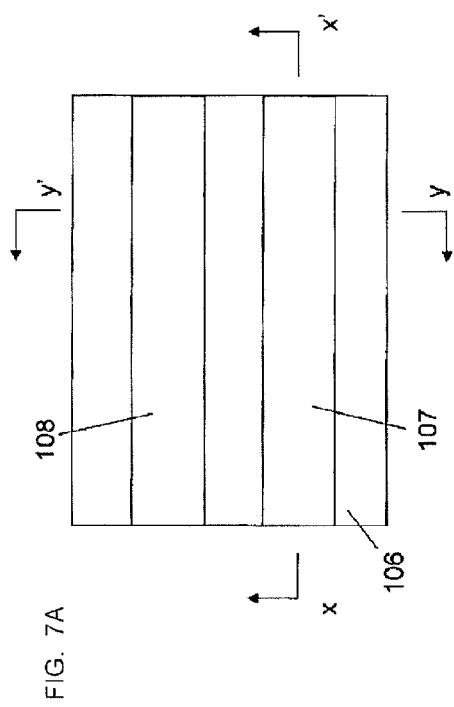
FIG. 7A is a plan view related to the method for manufacturing a semiconductor device according to one embodiment.
Figure 7B:
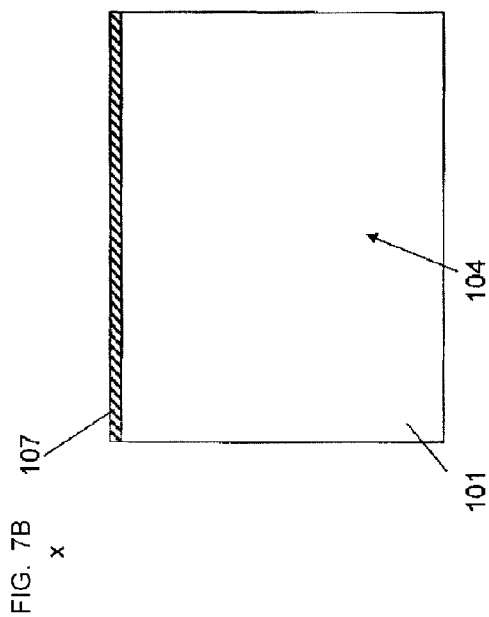
FIG. 7B is a cross-sectional view taken at line X-X' in FIG. 7A.

Referring to FIGS. 7A to 7C, second insulating films 107 and 108 are formed around the first fin-shaped silicon layers 104 and 105. The second insulating films 107 and 108 are preferably oxide films.

Figure 8A:
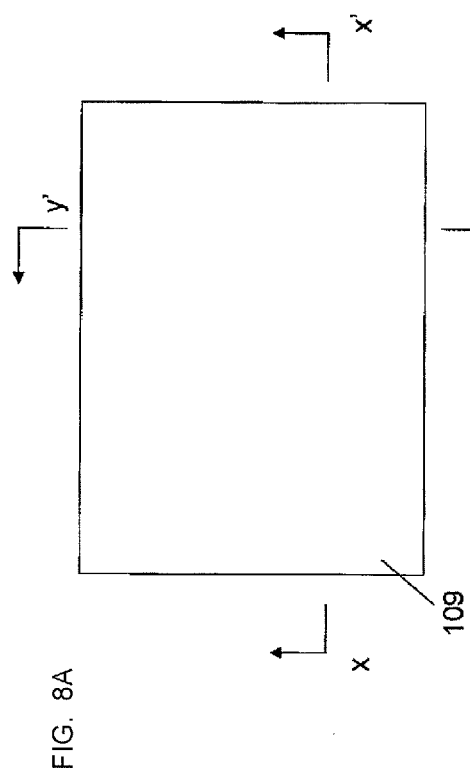
FIG. 8A is a plan view related to the method for manufacturing a semiconductor device according to one embodiment.
Figure 8C:
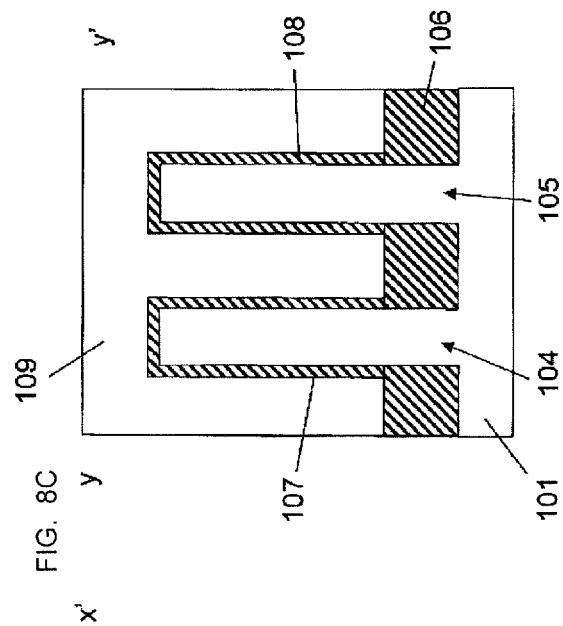
FIG. 8C is a cross-sectional view taken at line Y-Y' in FIG. 8A.
Figure 8B:
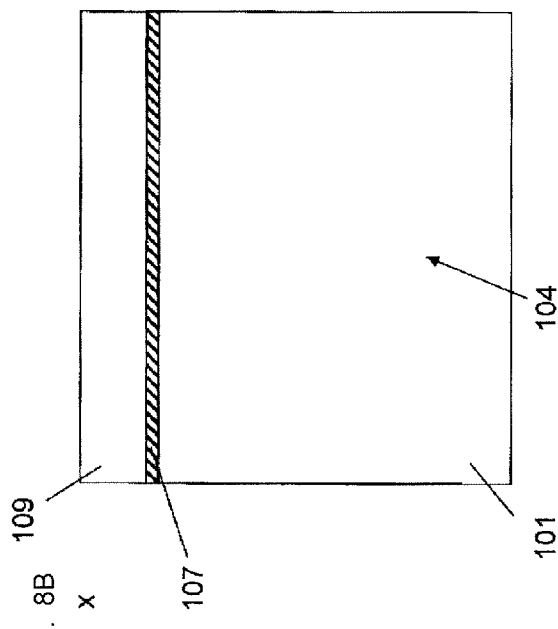
FIG. 8B is a cross-sectional view taken at line X-X' in FIG. 8A.

Referring to FIGS. 8A to 8C, a first polysilicon 109 is deposited on the second insulating films 107 and 108 to planarize the surface.

Referring to FIGS. 9A to 9C, a third insulating film 110 is formed on the first polysilicon 109. The third insulating film 110 is preferably a nitride film.

Referring to FIGS. 10A to 10C, a second resist 111 and a second resist 112 for forming first and second gate lines, first pillar-shaped semiconductor layers, and second pillar-shaped semiconductor layers are formed in a direction perpendicular to the first fin-shaped silicon layers 104 and 105.

Referring to FIGS. 11A to 11C, the third insulating film 110, the first polysilicon 109, the second insulating films 107 and 108, and the first fin-shaped silicon layers 104 and 105 are etched to form first pillar-shaped semiconductor layers 113 and 115, a first dummy gate 109a composed of the first polysilicon, second pillar-shaped semiconductor layers 114 and 116, and a second dummy gate 109b composed of the first polysilicon. During this process, the third insulating film 110 is divided into a third insulating film 110a and a third insulating film 110b. The second insulating films 107 and 108 are divided into second insulating films 107a, 107b, 108a, and 108b. If the second resists 111 and 112 are removed during etching, the third insulating films 110a and 110b serve as a hard mask. The third insulating film is not necessarily used if the second resists remain unremoved during etching.

Referring to FIGS. 12A to 12C, the second resists 111 and 112 are removed.

The description up to the preceding paragraph is the description of the second step that includes forming a second insulating film around the first fin-shaped semiconductor layers, depositing a first polysilicon on the second insulating film to perform planarization, forming second resists for forming a first gate line, a second gate line, a first pillar-shaped semiconductor layer, and a second pillar-shaped semiconductor layer, the second resists being formed in a direction perpendicular to the first fin-shaped semiconductor layers, and etching the first polysilicon, the second insulating film, and the first fin-shaped semiconductor layers so as to form first pillar-shaped semiconductor layers, a first dummy gate formed of the first polysilicon, second pillar-shaped semiconductor layers, and a second dummy gate formed of the first polysilicon.

Described next is a third step that includes forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate.

Figure 13A:
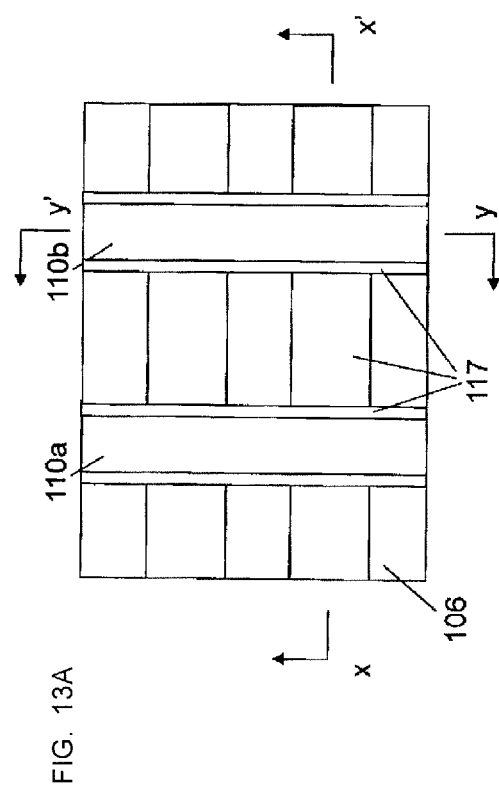
FIG. 13A is a plan view related to the method for manufacturing a semiconductor device according to one embodiment.
Figure 13B:
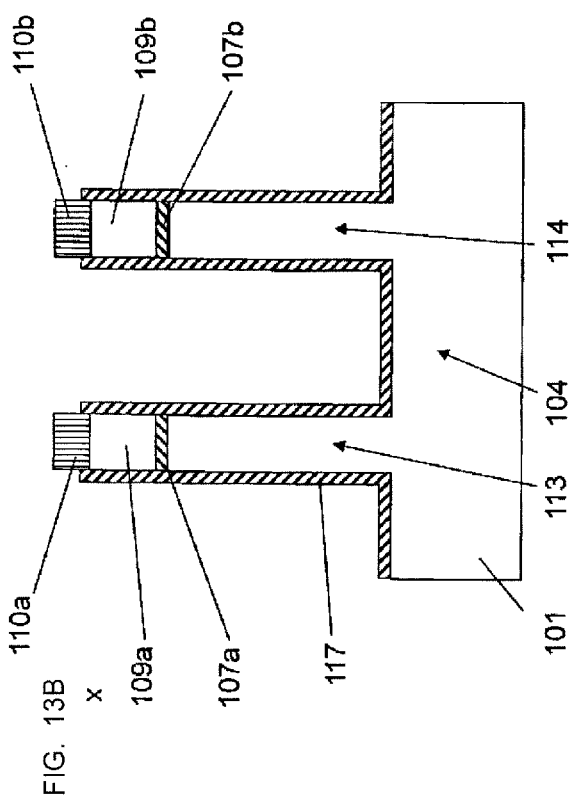
FIG. 13B is a cross-sectional view taken at line X-X' in FIG. 13A.
Figure 13C:
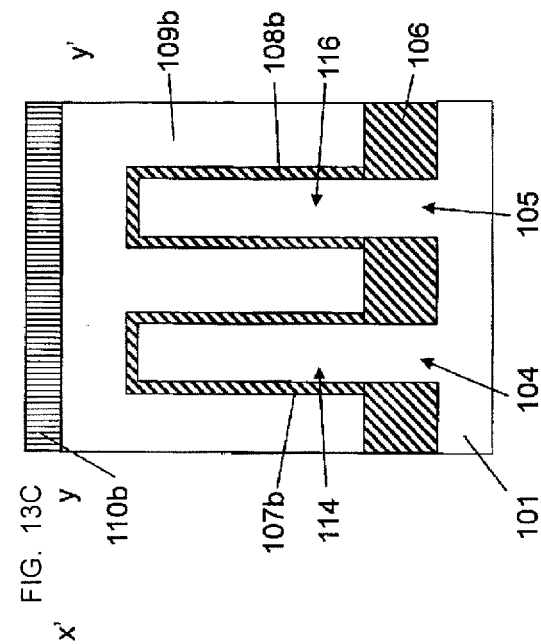
FIG. 13C is a cross-sectional view taken at line Y-Y' in FIG. 13A.

Referring to FIGS. 13A to 13C, a fourth insulating film 117 is formed around the first pillar-shaped semiconductor layers 113 and 115, the second pillar-shaped semiconductor layers 114 and 116, the first dummy gate 109a, and the second dummy gate 109b. The fourth insulating film 117 is preferably an oxide film.

Referring to FIGS. 14A to 14C, a second polysilicon 123 is deposited around the fourth insulating film 117.

Figure 15A:
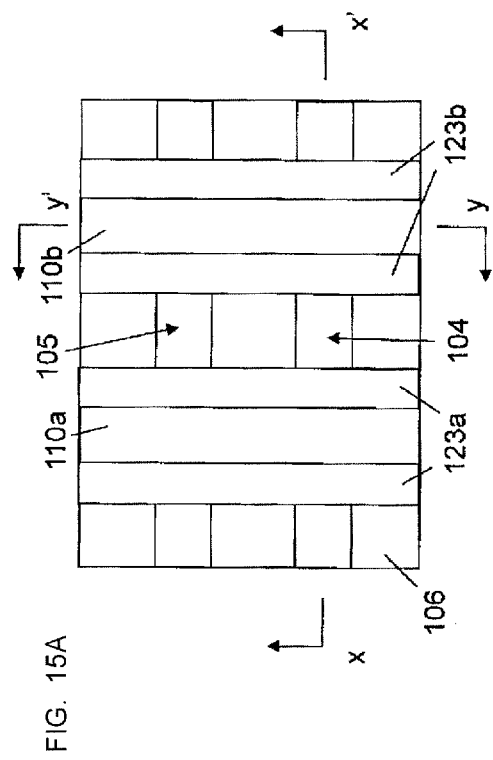
FIG. 15A is a plan view related to the method for manufacturing a semiconductor device according to one embodiment.
Figure 15B:
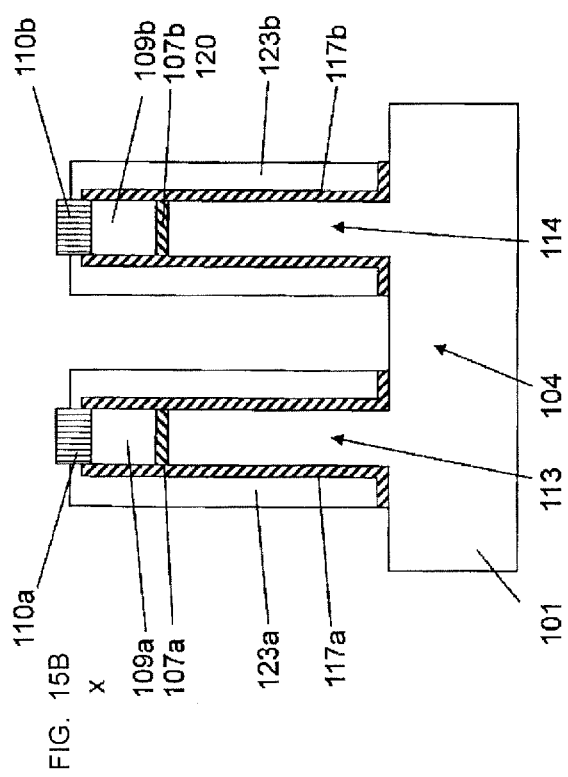
FIG. 15B is a cross-sectional view taken at line X-X' in FIG. 15A.
Figure 15C:
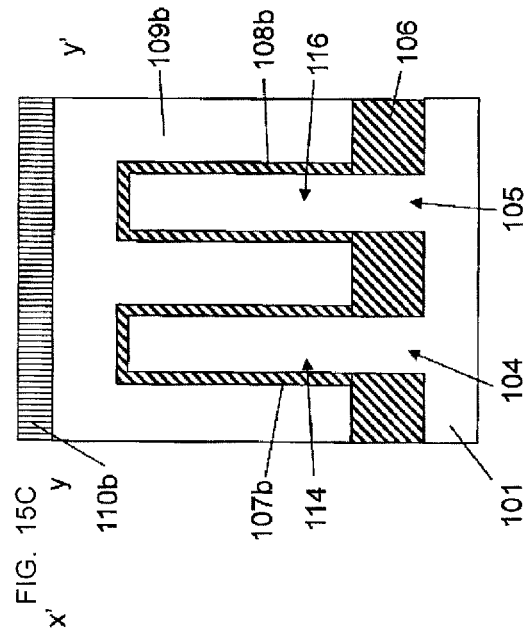
FIG. 15C is a cross-sectional view taken at line Y-Y' in FIG. 15A.

Referring to FIGS. 15A to 15C, the second polysilicon 123 is etched so that the second polysilicon 123 remains on side walls of the first dummy gate 109a, the first pillar-shaped semiconductor layers 113 and 115, the second dummy gate 109b, and the second pillar-shaped semiconductor layers 114 and 116. As a result, a third dummy gate 123a and a fourth dummy gate 123b are formed. During this process, the fourth insulating film 117 may be divided into a fourth insulating film 117a and a fourth insulating film 117b.

The description up to the preceding paragraph is the description of the third step that includes forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate.

Described next is a fourth step that includes forming second diffusion layers in upper portions of the first fin-shaped semiconductor layers, lower portions of the first pillar-shaped semiconductor layers, and lower portions of the second pillar-shaped semiconductor layers, forming a fifth insulating film around the third dummy gate and the fourth dummy gate, etching the fifth insulating film into a side wall shape so that side walls composed of the fifth insulating film are formed, and forming metal-semiconductor compounds on the second diffusion layers so as to form source lines.

Figure 16C:
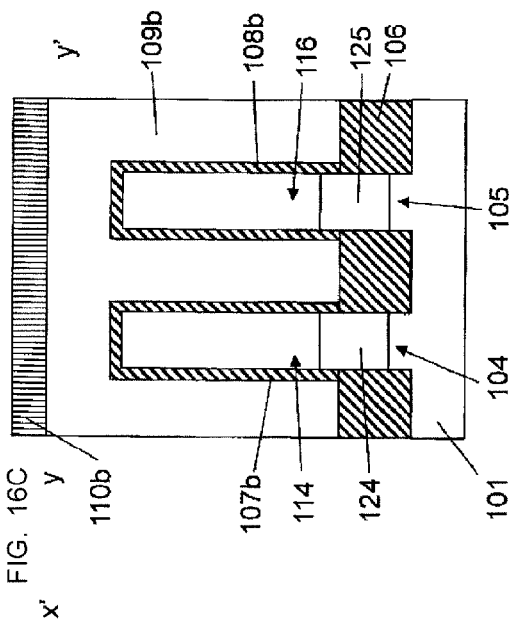
FIG. 16C is a cross-sectional view taken at line Y-Y' in FIG. 16A.
Figure 16A:
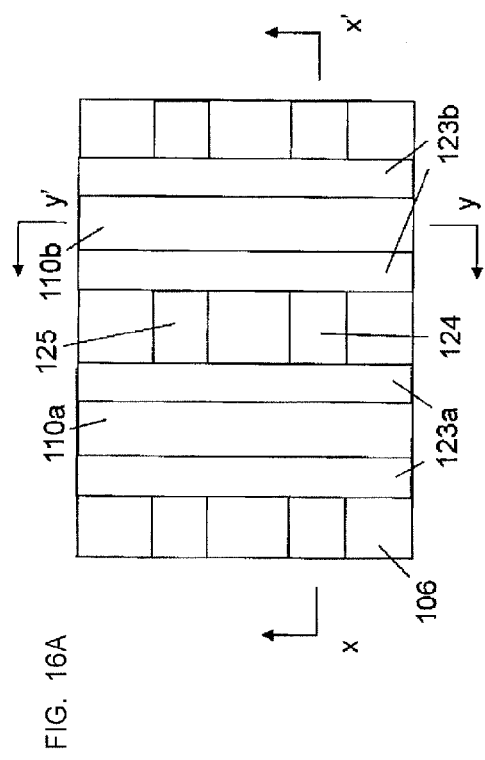
FIG. 16A is a plan view related to the method for manufacturing a semiconductor device according to one embodiment.
Figure 16B:
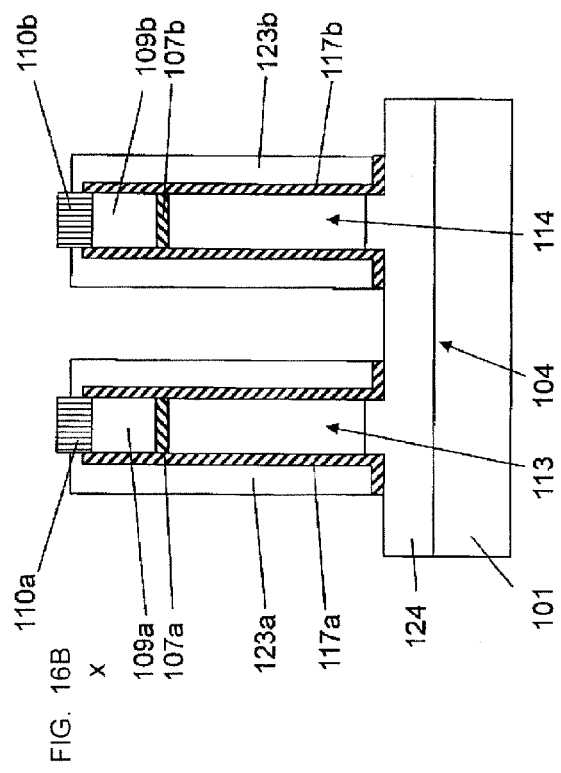
FIG. 16B is a cross-sectional view taken at line X-X' in FIG. 16A.

Referring to FIGS. 16A to 16C, an impurity is introduced to form second diffusion layers 124 and 125 in lower portions of the first pillar-shaped semiconductor layers 113 and 115, lower portions of the second pillar-shaped semiconductor layers 114 and 116, and upper portions of the first fin-shaped semiconductor layers 104 and 105. Arsenic or phosphorus is preferably introduced to form n-type diffusion layers. Boron is preferably introduced to form p-type diffusion layers. The diffusion layers may be formed after forming side walls formed of the fifth insulating film as described below.

Referring to FIGS. 17A to 17C, a fifth insulating film 126 is formed around the third dummy gate 123a and the fourth dummy gate 123b. The fifth insulating film 126 is preferably a nitride film.

Referring to FIGS. 18A to 18C, the fifth insulating film 126 is etched so that the fifth insulating film 126 remains as side walls. As a result, side walls 126a and 126b formed of the fifth insulating film are formed.

Referring to FIGS. 19A to 19C, metal-semiconductor compounds 127a, 127b, 127c, 128a, 128b, and 128c are formed in upper portions of the second diffusion layers 124 and 125. During this process, metal-semiconductor compounds 129a and 129b may be formed in the upper portions of the third dummy gate 123a and the fourth dummy gate 123b.

The description up to the preceding paragraph is the description of the fourth step that includes forming second diffusion layers in upper portions of the first fin-shaped semiconductor layers, lower portions of the first pillar-shaped semiconductor layers, and lower portions of the second pillar-shaped semiconductor layers, forming a fifth insulating film around the third dummy gate and the fourth dummy gate, etching the fifth insulating film into a side wall shape so that side walls composed of the fifth insulating film are formed, and forming metal-semiconductor compounds on the second diffusion layers so as to form source lines.

Described next is a fifth step that includes depositing an interlayer insulating film to planarize the surface, exposing upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film, which will form a first gate insulating film and a second gate insulating film, around the first pillar-shaped semiconductor layers, around the second pillar-shaped semiconductor layers, and on inner sides of the side walls formed of the fifth insulating film, depositing a metal, and etching back the metal to form a first gate line around the first pillar-shaped semiconductor layers and a second gate line around the second pillar-shaped semiconductor layers.

Referring to FIGS. 20A to 20C, a nitride film 130 is deposited and an interlayer insulating film 131 is deposited.

Figure 21C:
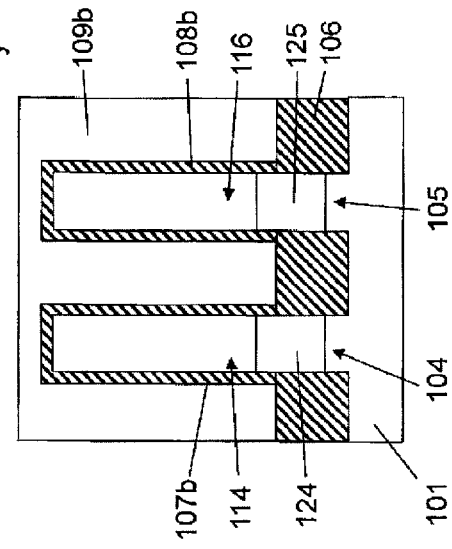
FIG. 21C is a cross-sectional view taken at line Y-Y' in FIG. 21A.
Figure 21A:
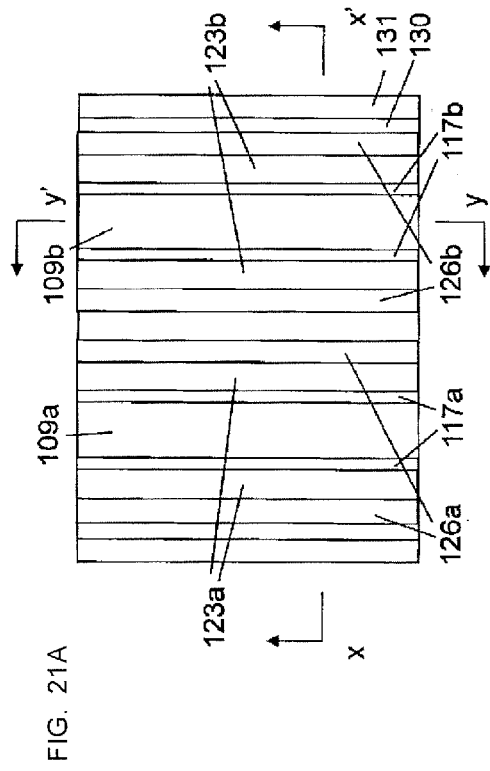
FIG. 21A is a plan view related to the method for manufacturing a semiconductor device according to one embodiment.
Figure 21B:
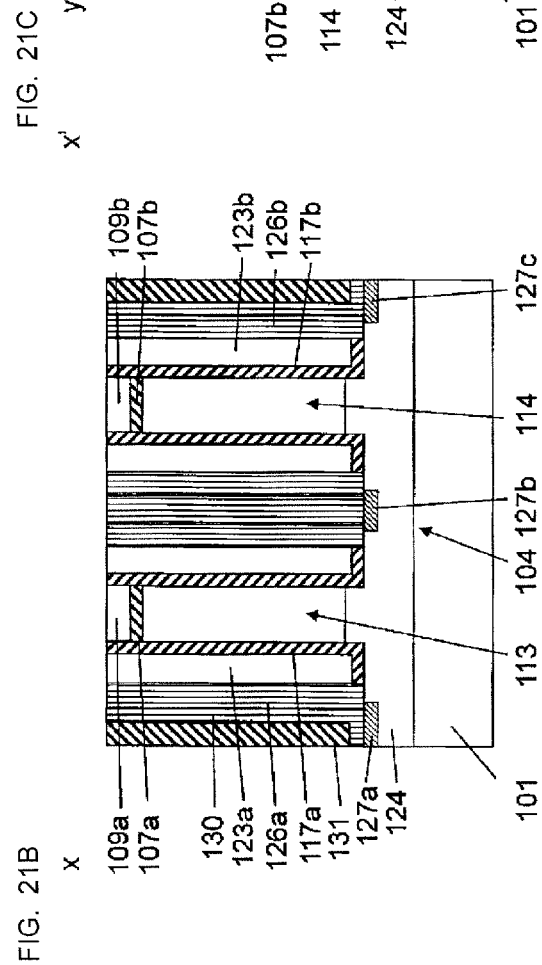
FIG. 21B is a cross-sectional view taken at line X-X' in FIG. 21A.

Referring to FIGS. 21A to 21C, chemical mechanical polishing is performed to expose upper portions of the first dummy gate 109a, the second dummy gate 109b, the third dummy gate 123a, and the fourth dummy gate 123b. During this process, the metal-semiconductor compounds 129a and 129b on the third dummy gate 123a and the fourth dummy gate 123b are removed.

Figure 22A:
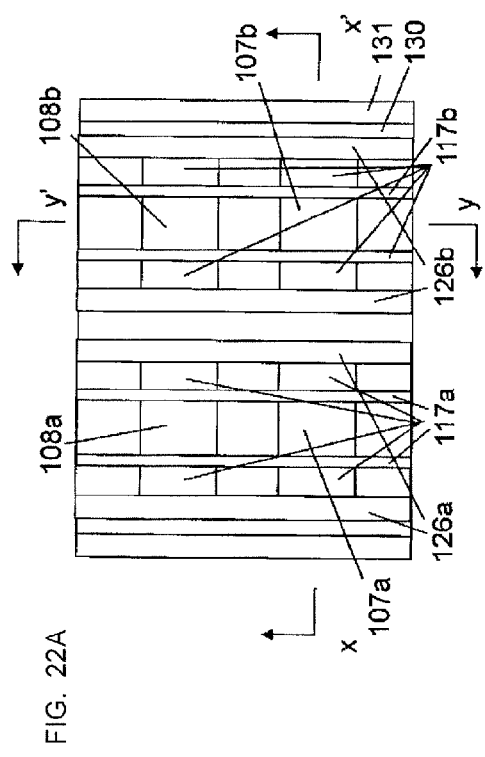
FIG. 22A is a plan view related to the method for manufacturing a semiconductor device according to one embodiment.
Figure 22C:
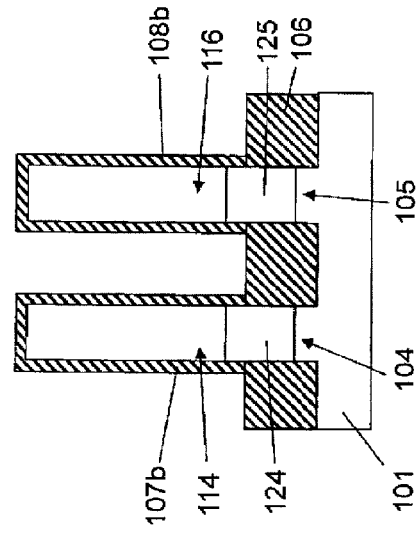
FIG. 22C is a cross-sectional view taken at line Y-Y' in FIG. 22A.
Figure 22B:
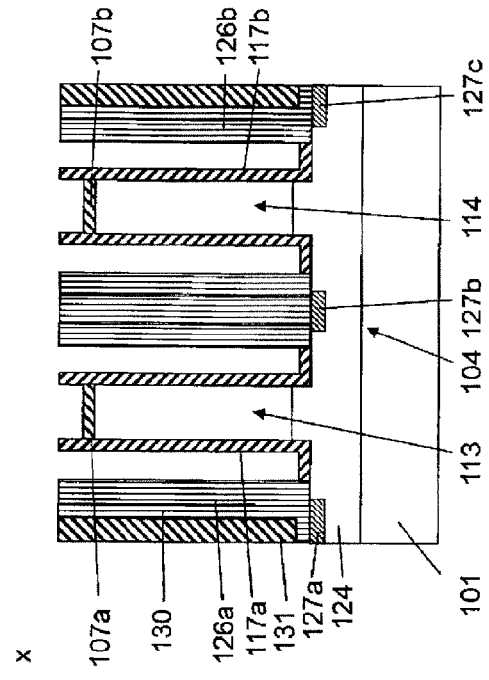
FIG. 22B is a cross-sectional view taken at line X-X' in FIG. 22A.

Referring to FIGS. 22A to 22C, the first dummy gate 109a, the second dummy gate 109b, the third dummy gate 123a, and the fourth dummy gate 123b are removed.

Referring to FIGS. 23A to 23C, the second insulating films 107a, 107b, 108a, and 108b and the fourth insulating films 117a and 117b are removed.

Referring to FIGS. 24A to 24C, a gate insulating film 132 which will form first and second gate insulating films is formed around the first pillar-shaped semiconductor layers 113 and 115, around the second pillar-shaped semiconductor layers 114 and 116, and on the inner sides of the fifth insulating films 126a and 126b.

Figure 25C:
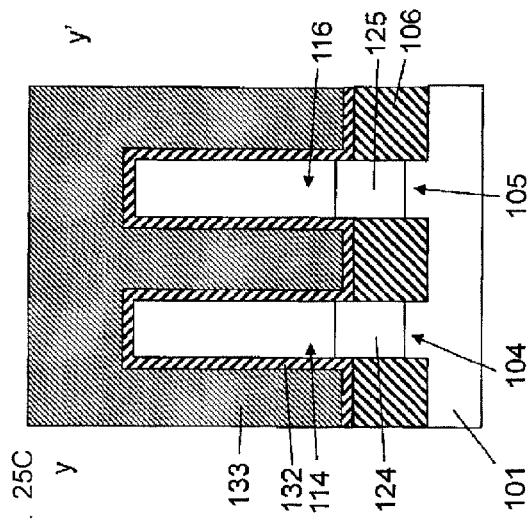
FIG. 25C is a cross-sectional view taken at line Y-Y' in FIG. 25A.
Figure 25A:
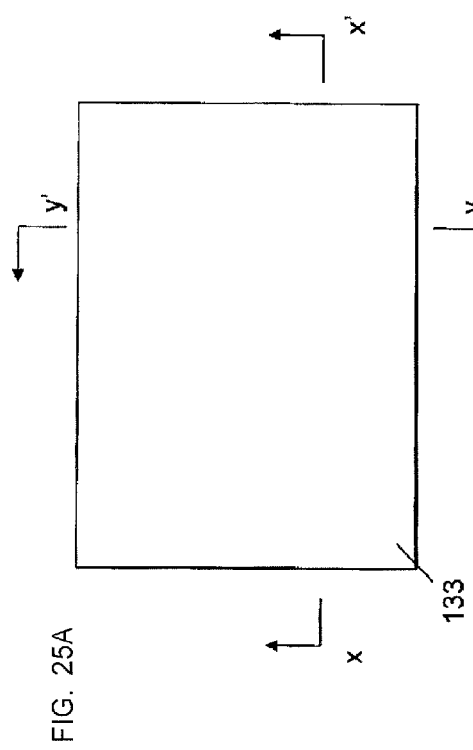
FIG. 25A is a plan view related to the method for manufacturing a semiconductor device according to one embodiment.
Figure 25B:
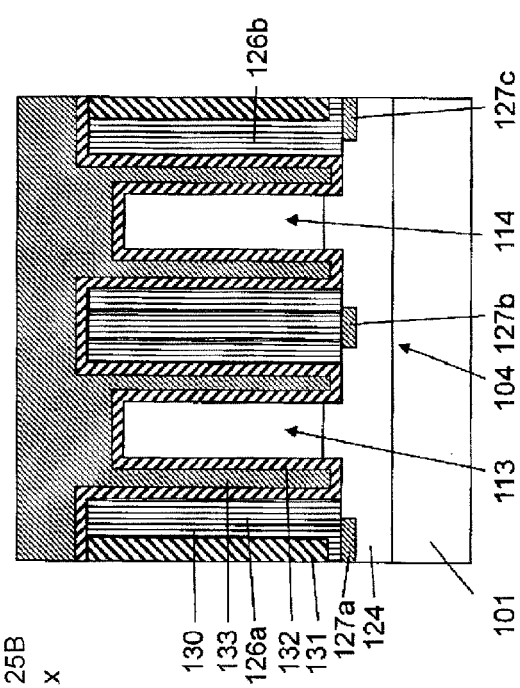
FIG. 25B is a cross-sectional view taken at line X-X' in FIG. 25A.

Referring to FIGS. 25A to 25C, a metal 133 is deposited.

Referring to FIGS. 26A to 26C, the metal 133 is etched back to form a first gate line 133a around the first pillar-shaped semiconductor layers 113 and 115 and a second gate line 133b around the second pillar-shaped semiconductor layers 114 and 116.

The description up to the preceding paragraph is the description of the fifth step that includes depositing an interlayer insulating film to planarize the surface, exposing upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film, which will form a first gate insulating film and a second gate insulating film, around the first pillar-shaped semiconductor layers, around the second pillar-shaped semiconductor layers, and on inner sides of the side walls formed of the fifth insulating film, depositing a metal, and etching back the metal to form a first gate line around the first pillar-shaped semiconductor layers and a second gate line around the second pillar-shaped semiconductor layers.

Described next is a sixth step that includes removing exposed portions of the gate insulating film, which will form a first gate insulating film and a second gate insulating film, forming a gate insulating film, which will form a third gate insulating film and a fourth gate insulating film, around upper portions of the first pillar-shaped semiconductor layers, around upper portions of the second pillar-shaped semiconductor layers, and on inner sides of the side walls formed of the fifth insulating film, depositing a metal, etching back the metal to form a first contact electrode line around upper portions of the first pillar-shaped semiconductor layers and a third contact electrode line around the second pillar-shaped semiconductor layers, removing portions of the gate insulating film, which will form a third gate insulating film and a fourth gate insulating film, the portions being exposed on the first pillar-shaped semiconductor layers and the second pillar-shaped semiconductor layers, depositing a metal, etching back the metal so as to form a second contact electrode line and a fourth contact electrode line, and etching the first contact electrode line, the second contact electrode line, the third contact electrode line, and the fourth contact electrode line to form first contact electrodes, second contact electrodes, third contact electrodes, and fourth contact electrodes.

Figure 27C:
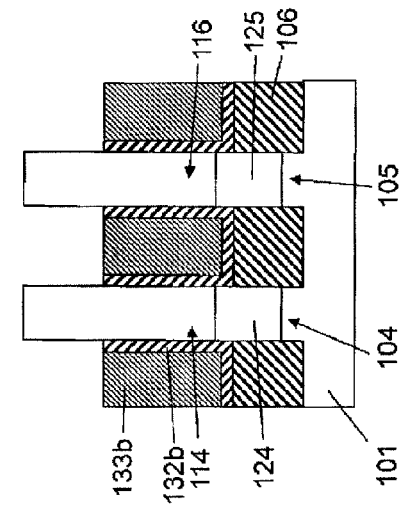
FIG. 27C is a cross-sectional view taken at line Y-Y' in FIG. 27A.
Figure 27A:
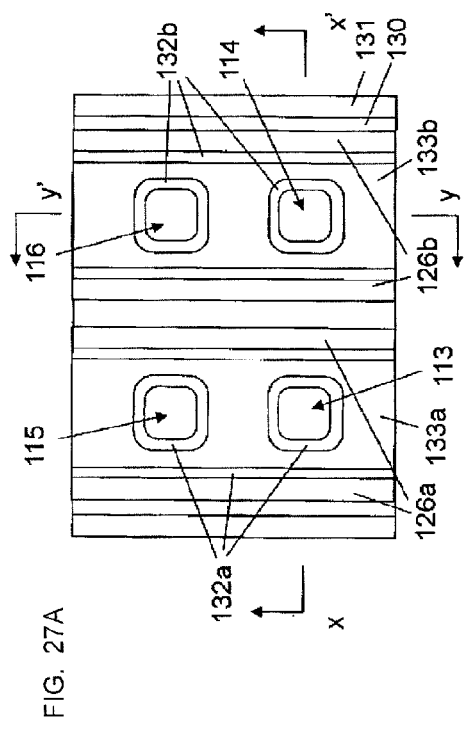
FIG. 27A is a plan view related to the method for manufacturing a semiconductor device according to one embodiment.
Figure 27B:
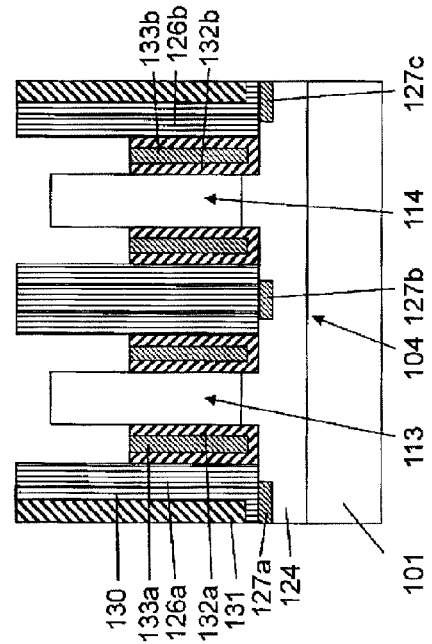
FIG. 27B is a cross-sectional view taken at line X-X' in FIG. 27A.

Referring to FIGS. 27A to 27C, exposed portions of the gate insulating film 132 which will form first and second gate insulating films are removed. As a result, the gate insulating film 132 is divided into a first gate insulating film 132a and a second gate insulating film 132b.

Referring to FIGS. 28A to 28C, a gate insulating film 134, which will form third and fourth gate insulating films, is formed around upper portions of the first pillar-shaped semiconductor layers 113 and 115, around the second pillar-shaped semiconductor layers 114 and 116, and on the inner sides of the fifth insulating films 126a and 126b.

Referring to FIGS. 29A to 29C, a metal 135 is deposited.

Referring to FIGS. 30A to 30C, the metal 135 is etched back to form a first contact electrode line 135a around the first pillar-shaped semiconductor layers 113 and 115 and a third contact electrode line 135b around the second pillar-shaped semiconductor layers 114 and 116.

Figure 31C:
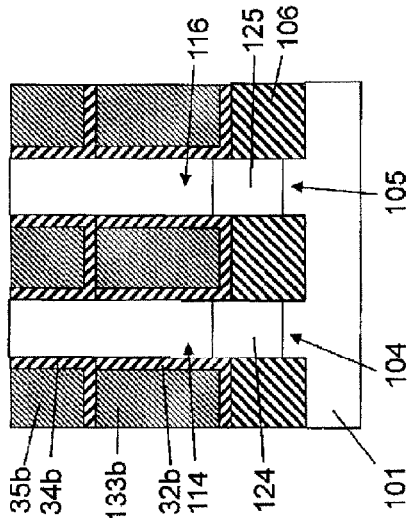
FIG. 31C is a cross-sectional view taken at line Y-Y' in FIG. 31A.
Figure 31A:
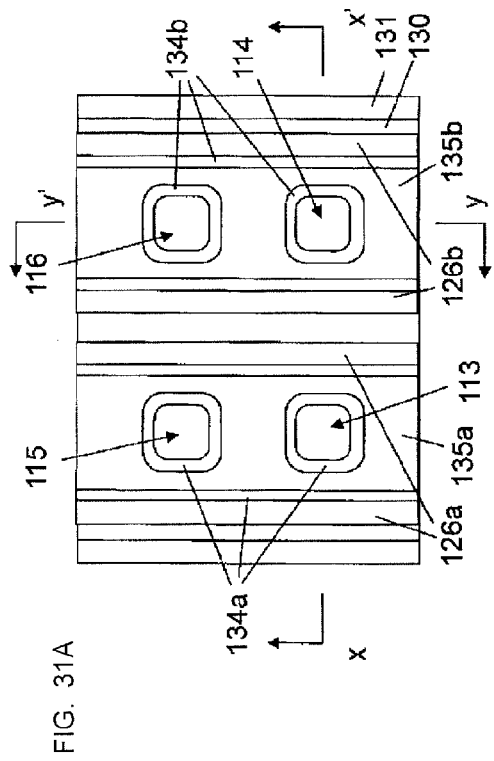
FIG. 31A is a plan view related to the method for manufacturing a semiconductor device according to one embodiment.
Figure 31B:
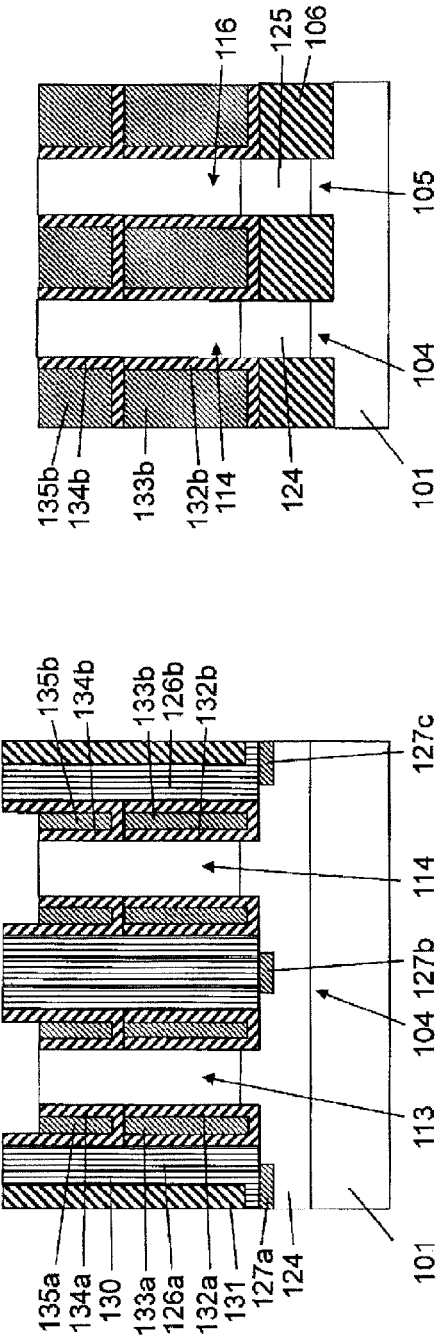
FIG. 31B is a cross-sectional view taken at line X-X' in FIG. 31A.

Referring to FIGS. 31A to 31C, exposed portions of the gate insulating film 134, which will form third and fourth gate insulting films, on the first pillar-shaped semiconductor layers 113 and 115 and the second pillar-shaped semiconductor layers 114 and 116 are removed. As a result, the gate insulating film 134 is divided into a third gate insulating film 134a and a fourth gate insulating film 134b.

Referring to FIGS. 32A to 32C, a metal is deposited and etched back to form a second contact electrode line 136a and a fourth contact electrode line 136b.

Figure 33C:
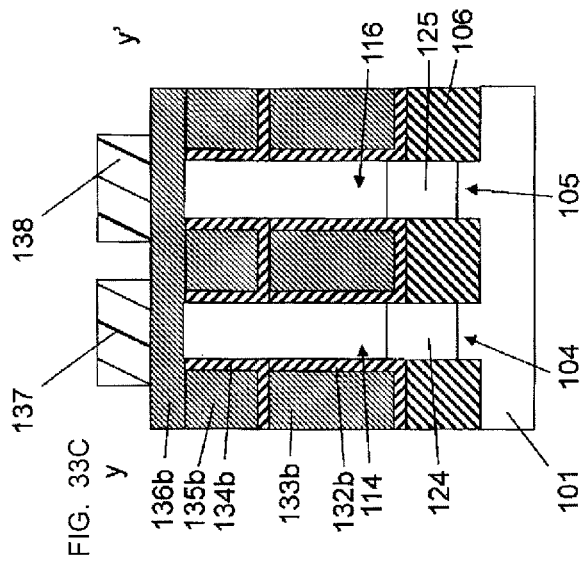
FIG. 33C is a cross-sectional view taken at line Y-Y' in FIG. 33A.
Figure 33A:
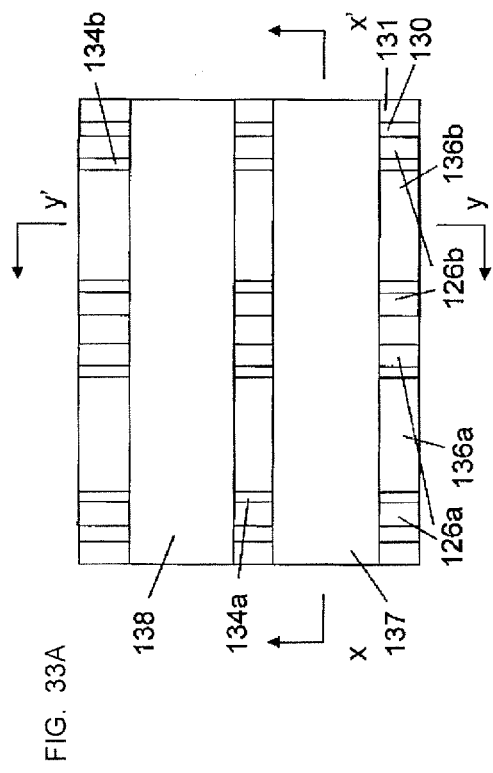
FIG. 33A is a plan view related to the method for manufacturing a semiconductor device according to one embodiment.
Figure 33B:
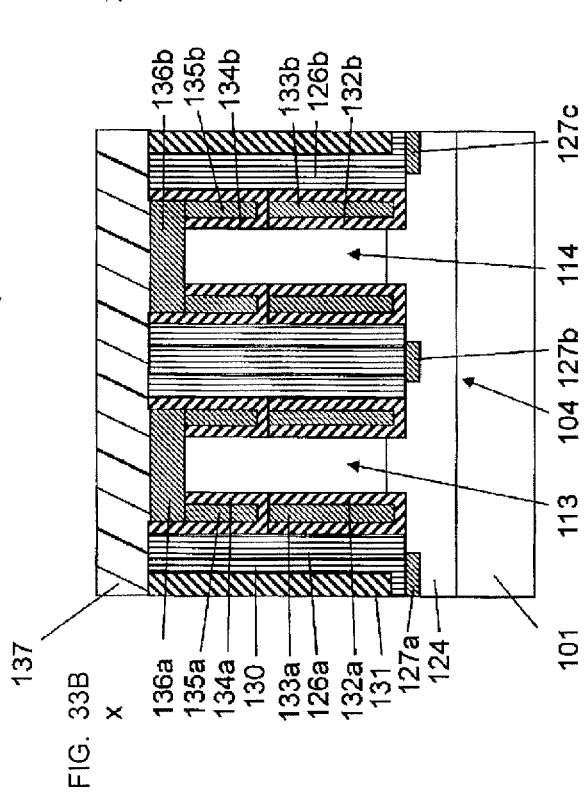
FIG. 33B is a cross-sectional view taken at line X-X' in FIG. 33A.

Referring to FIGS. 33A to 33C, third resists 137 and 138 are formed.

Referring to FIGS. 34A to 34C, the first contact electrode line 135a, the second contact electrode line 136a, the third contact electrode line 135b, and the fourth contact electrode line 136b are etched to form first contact electrodes 139a and 139c, second contact electrodes 140a and 140c, third contact electrodes 139b and 139d, and fourth contact electrodes 140b and 140d.

Figure 35C:
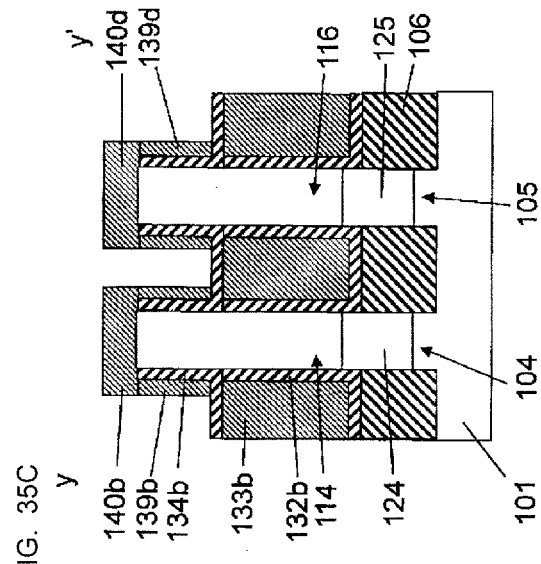
FIG. 35C is a cross-sectional view taken at line Y-Y' in FIG. 35A.
Figure 35A:
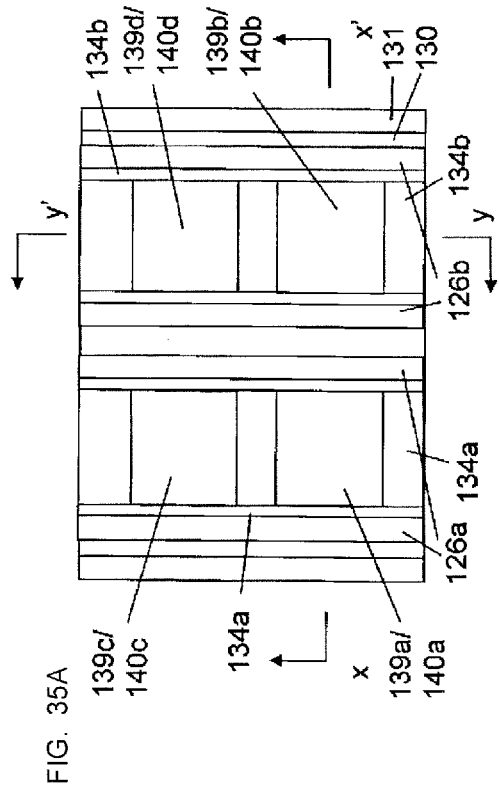
FIG. 35A is a plan view related to the method for manufacturing a semiconductor device according to one embodiment.
Figure 35B:
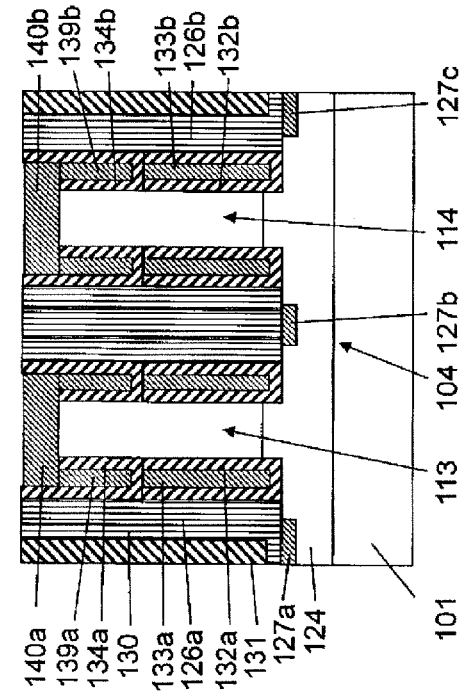
FIG. 35B is a cross-sectional view taken at line X-X' in FIG. 35A.

Referring to FIGS. 35A to 35C, the third resists 137 and 138 are removed.

The description up to the preceding paragraph is the description of the sixth step that includes removing exposed portions of the gate insulating film, which will form a first gate insulating film and a second gate insulating film, forming a gate insulating film, which will form a third gate insulating film and a fourth gate insulating film, around upper portions of the first pillar-shaped semiconductor layers, around upper portions of the second pillar-shaped semiconductor layers, and on inner sides of the side walls formed of the fifth insulating film, depositing a metal, etching back the metal to form a first contact electrode line around upper portions of the first pillar-shaped semiconductor layers and a third contact electrode line around the second pillar-shaped semiconductor layers, removing portions of the gate insulating film, which will form a third gate insulating film and a fourth gate insulating film, the portions being exposed on the first pillar-shaped semiconductor layers and the second pillar-shaped semiconductor layers, depositing a metal, etching back the metal so as to form a second contact electrode line and a fourth contact electrode line, and etching the first contact electrode line, the second contact electrode line, the third contact electrode line, and the fourth contact electrode line to form first contact electrodes, second contact electrodes, third contact electrodes, and fourth contact electrodes.

Described next is a seventh step that includes depositing a second interlayer insulating film to planarize the surface, exposing upper portions of the second contact electrodes and upper portions of the fourth contact electrodes, and forming first magnetic tunnel junction memory elements on the second contact electrodes and second magnetic tunnel junction memory elements on the fourth contact electrodes.

Referring to FIGS. 36A to 36C, a second interlayer insulating film 141 is deposited to planarize the surface, and upper portions of the second contact electrodes 140a and 140c and upper portions of the fourth contact electrodes 140b and 140d are exposed.

Referring to FIGS. 37A to 37C, a metal 142 for a lower electrode, a film 143 for a pinned phase, a film 144 for a tunnel barrier layer, a film 145 for a free layer, and a metal 146 for an upper electrode are deposited. The film 143 for a pinned phase is preferably composed of CoFeB. The film 144 for a tunnel barrier layer is preferably composed of MgO. The film 145 for a free layer is preferably composed of CoFeB and may have a double MgO free layer structure.

Figures 38A, 38B, 38C:
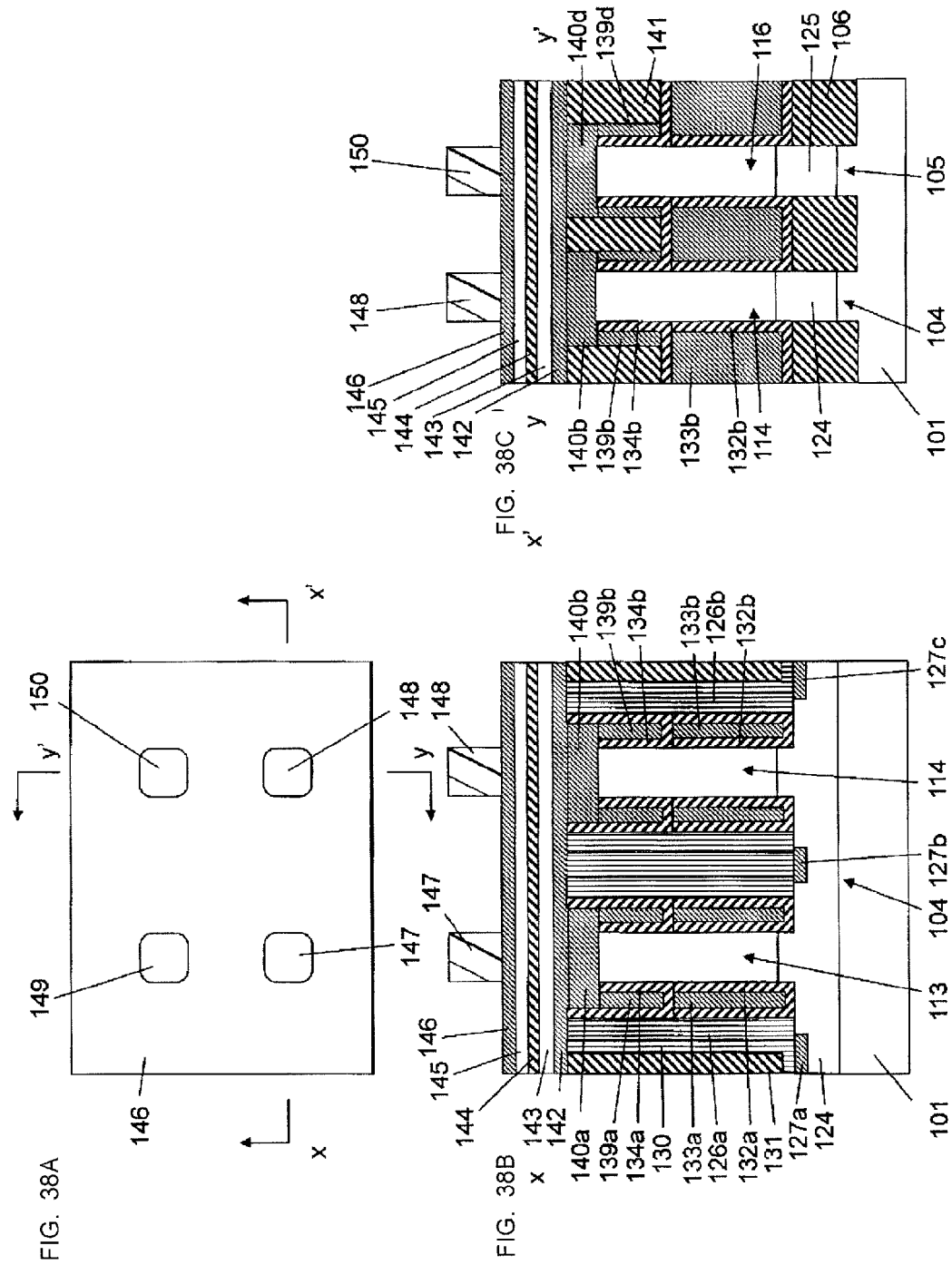
FIG. 38A is a plan view related to the method for manufacturing a semiconductor device according to one embodiment.
FIG. 38B is a cross-sectional view taken at line X-X' in FIG. 38A.
FIG. 38C is a cross-sectional view taken at line Y-Y' in FIG. 38A.

Referring to FIGS. 38A to 38C, fourth resists 147, 148, 149, and 150 for forming first and second magnetic tunnel junction memory elements are formed.

Referring to FIGS. 39A to 39C, the metal 142 for a lower electrode, the film 143 for a pinned phase, the film 144 for a tunnel barrier layer, the film 145 for a free layer, and the metal 146 for an upper electrode are etched. The metal 142 is divided into lower electrodes 142a, 142b, 142c, and 142d. The film 143 for a pinned phase is divided into pinned phases 143a, 143b, 143c, and 143d. The film 144 for a tunnel barrier layer is divided into tunnel barrier layers 144a, 144b, 144c, and 144d. The film 145 for a free layer is divided into free layers 145a, 145b, 145c, and 145d. The metal 146 for an upper electrode is divided into upper electrodes 146a, 146b, 146c, and 146d.

Referring to FIGS. 40A to 40C, the fourth resists 147, 148, 149, and 150 are removed.

Referring to FIGS. 41A to 41C, the third interlayer insulating film 151 is deposited and etched back to expose upper portions of the upper electrodes 146a, 146b, 146c, and 146d.

Referring to FIGS. 42A to 42C, a metal 152 is deposited.

Referring to FIGS. 43A to 43C, a fifth resist 153 and a fifth resist 154 for forming bit lines are formed.

Referring to FIGS. 44A to 44C, the metal 152 is etched to form bit lines 152a and 152b.

Referring to FIGS. 45A to 45C, the fifth resists 153 and 154 are removed.

The description up to the preceding paragraph is the description of the seventh step that includes depositing a second interlayer insulating film to planarize the surface, exposing upper portions of the second contact electrodes and upper portions of the fourth contact electrodes, and forming first magnetic tunnel junction memory elements on the second contact electrodes and second magnetic tunnel junction memory elements on the fourth contact electrodes.

This ends the description of the process for manufacturing a structure of a semiconductor device according to an embodiment of the present invention.

It should be understood that various other embodiments, alterations, and modifications are possible without departing from the broad spirit and scope of the present invention and the embodiments described above are merely for illustrative purpose only and do not limit the scope of the present invention.

For example, in the embodiments described above, a method for manufacturing a semiconductor device in which the conductivity of various p-type (including $p^+$ type) parts and n-type (including $n^+$ type) parts is reversed and a semiconductor device obtained by such an method are naturally within the technical scope of the present invention.

What is claimed is:

1. A semiconductor device comprising:
   a first fin-shaped semiconductor layer on a semiconductor substrate;
   a first insulating film around the first fin-shaped semiconductor layer;
   a first pillar-shaped semiconductor layer on the first fin-shaped semiconductor layer;
   a first gate insulating film around the first pillar-shaped semiconductor layer;
   a first gate line around the first gate insulating film and extending in a direction perpendicular to the first fin-shaped semiconductor layer;
   a diffusion layer in a lower portion of the first pillar-shaped semiconductor layer;
   a third gate insulating film surrounding an upper portion of the first pillar-shaped semiconductor layer;
   a first contact electrode surrounding the third gate insulating film,
   wherein an upper portion of the first contact electrode is electrically connected to the upper portion of the first pillar-shaped semiconductor layer; and
   a first magnetic tunnel junction memory element electrically connected to the upper portion of the first pillar-shaped semiconductor layer.

2. The semiconductor device according to claim 1, wherein the first contact electrode is composed of a metal having a work function in the range of 4.0 eV to 4.2 eV.

3. The semiconductor device according to claim 1, wherein the first contact electrode is composed of a metal having a work function in the range of 5.0 eV to 5.2 eV.

4. The semiconductor device according to claim 1, further comprising a first bit line extending in a direction perpendicular to the first gate line and connected to an upper portion of the first magnetic tunnel junction memory element.

5. A semiconductor device comprising:
   a first fin-shaped semiconductor layer on a semiconductor substrate;
   a first insulating film around the first fin-shaped semiconductor layer;
   a first pillar-shaped semiconductor layer on the first fin-shaped semiconductor layer;
   a first gate insulating film around the first pillar-shaped semiconductor layer;
   a first gate line around the first gate insulating film and extending in a direction perpendicular to the first fin-shaped semiconductor layer;
   a diffusion layer in a lower portion of the first pillar-shaped semiconductor layer;
   a third gate insulating film surrounding an upper portion of the first pillar-shaped semiconductor layer;
   a first contact electrode surrounding the third gate insulating film,
   wherein an upper portion of the first contact electrode is electrically connected to the upper portion of the first pillar-shaped semiconductor layer; and a first magnetic tunnel junction memory element electrically connected to the upper portion of the first pillar-shaped semiconductor layer.

6. The semiconductor device according to claim 5, wherein the first gate line and the second gate line are each composed of a metal.

7. The semiconductor device according to claim 5, wherein a width of the first pillar-shaped semiconductor layer in a direction perpendicular to the first fin-shaped semiconductor layer is equal to a width of the first fin-shaped semiconductor layer in the direction perpendicular to the first fin-shaped semiconductor layer.

8. The semiconductor device according to claim 5, further comprising a first gate insulating film around and at a bottom portion of the first gate line.

* * * * *